(12) United States Patent
Koenig et al.

(10) Patent No.: US 10,370,240 B2
(45) Date of Patent: Aug. 6, 2019

(54) LAYER STRUCTURE AND METHOD OF MANUFACTURING A LAYER STRUCTURE

(71) Applicant: Infineon Technologies AG, Neubiberg (DE)

(72) Inventors: Matthias Koenig, Regensburg (DE); Guenther Ruhl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/646,161

(22) Filed: Jul. 11, 2017

(65) Prior Publication Data

US 2018/0016132 A1  Jan. 18, 2018

(30) Foreign Application Priority Data

Jul. 12, 2016 (DE) .......... 10 2016 112 762

(51) Int. Cl.
*B81C 1/00* (2006.01)
*B81B 3/00* (2006.01)

(52) U.S. Cl.
CPC ........ *B81B 3/0072* (2013.01); *B81C 1/00158* (2013.01); *B81C 1/00476* (2013.01); *B81B 2201/0257* (2013.01); *B81B 2203/0127* (2013.01); *B81C 2201/0109* (2013.01); *B81C 2201/0187* (2013.01); *B81C 2201/0197* (2013.01)

(58) Field of Classification Search
CPC .......... B81B 3/0072; B81B 2201/0257; B81B 2203/0127; B81C 1/00476; B81C 2201/0109; B81C 2201/0187; B81C 2201/0197

USPC .......................................... 257/416; 438/50
See application file for complete search history.

(56) References Cited

U.S. PATENT DOCUMENTS

| | | |
|---|---|---|
| 2004/0218877 A1 | 11/2004 | Xie |
| 2005/0016288 A1 | 1/2005 | Muchow et al. |
| 2005/0046541 A1 | 3/2005 | Fouillet |
| 2010/0140723 A1 | 6/2010 | Kurtz et al. |

(Continued)

FOREIGN PATENT DOCUMENTS

| | | |
|---|---|---|
| DE | 69804352 T2 | 10/2002 |
| DE | 10323559 A1 | 12/2004 |

(Continued)

OTHER PUBLICATIONS

Changyao Chen et al., "Performance of monolayer graphene nanomechanical resonators with electrical readout", Nature Nanotechnology, Dec. 2009, pp. 861-867, vol. 4.

(Continued)

*Primary Examiner* — Didarul A Mazumder
(74) *Attorney, Agent, or Firm* — Viering, Jentschura & Partner MBB

(57) ABSTRACT

A layer structure may include a carrier, a two-dimensional layer, and a holding structure. The holding structure is arranged on the carrier and holds the two-dimensional layer on the carrier such that at least a portion of the two-dimensional layer is spaced apart from the carrier. The holding structure includes a holding portion extending from the two-dimensional layer towards the carrier beyond the at least a portion of the two-dimensional layer spaced apart from the carrier.

17 Claims, 25 Drawing Sheets

(56) References Cited

U.S. PATENT DOCUMENTS

| | | | |
|---|---|---|---|
| 2012/0058350 A1* | 3/2012 | Long | B82Y 10/00 |
| | | | 428/446 |
| 2012/0256167 A1* | 10/2012 | Heo | H01L 29/1606 |
| | | | 257/27 |
| 2013/0018599 A1* | 1/2013 | Peng | B82Y 15/00 |
| | | | 702/30 |
| 2014/0145148 A1* | 5/2014 | Lee | H01L 29/775 |
| | | | 257/29 |
| 2014/0270271 A1 | 9/2014 | Dehe et al. | |
| 2014/0346579 A1* | 11/2014 | Franke | G01R 33/07 |
| | | | 257/295 |
| 2015/0090043 A1* | 4/2015 | Ruhl | G01N 3/02 |
| | | | 73/777 |
| 2015/0102807 A1* | 4/2015 | Eckinger | G01R 33/072 |
| | | | 324/251 |

FOREIGN PATENT DOCUMENTS

| | | |
|---|---|---|
| DE | 102006059091 A1 | 7/2007 |
| DE | 102014204712 A1 | 9/2014 |
| JP | 2010245797 A | 10/2010 |
| KR | 1020160070638 A | 6/2016 |

OTHER PUBLICATIONS

Robert A. Barton et al., "Fabrication and performance of graphene nanoelectromechanical systems", Journal of Vacuum Science & Technology B, Sep./Oct. 2011, vol. 29, No. 5, American Vacuum Society.

Luca Banszerus et al., "Ultrahigh-mobility graphene devices from chemical vapor deposition on reusable copper", Science Advances, Jul. 31, 2015, the American Association for the Advancement of Science (AAAS), Washington, DC.

K.I. Bolotin et al., "Temperature dependent transport in suspended graphene", May 13, 2008.

* cited by examiner

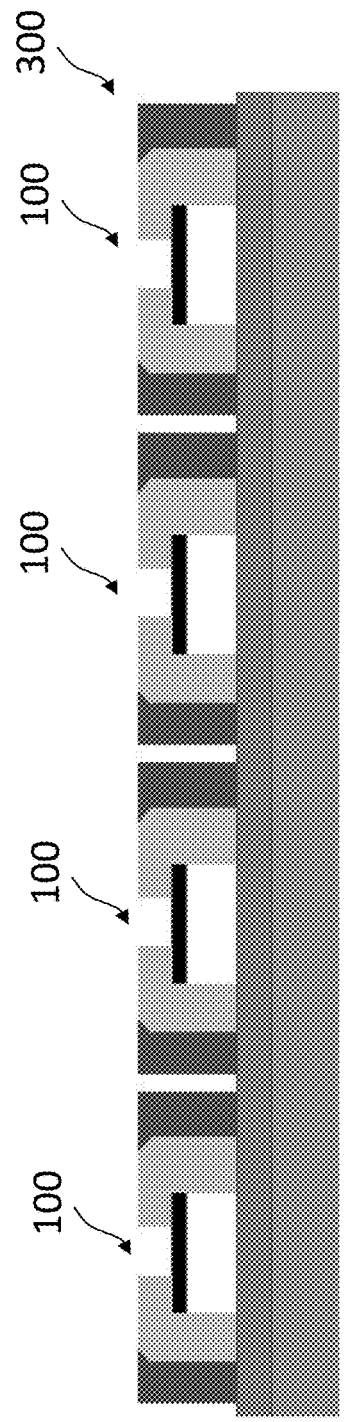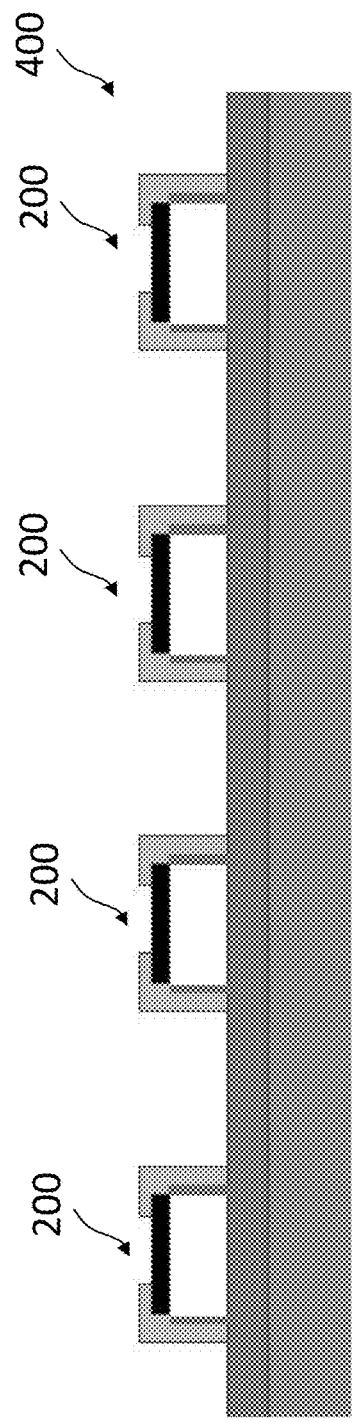

LAYER STRUCTURE AND METHOD OF MANUFACTURING A LAYER STRUCTURE

CROSS-REFERENCE TO RELATED APPLICATION

This application claims priority to German Patent Application Serial No. 10 2016 112 762.0, which was filed Jul. 12, 2016, and is incorporated herein by reference in its entirety.

TECHNICAL FIELD

Various aspects of this disclosure relate generally to layer structures having a two-dimensional layer, and to methods of manufacturing a layer structure having a two-dimensional layer.

BACKGROUND

Two-dimensional layers have gained significant technical importance in the past few years due to their outstanding electrical and mechanical properties, e.g. due to their high charge carrier mobilities up to 100.000 cm$^2$/Vs, Young's moduli of up to 1.1 TPa, and high breaking strengths. These properties of two-dimensional layers, however, can only be attained and maintained, when the two-dimensional layers have very little interaction with a substrate. For this reason, two-dimensional layers are usually employed as suspended layers.

Suspended two-dimensional layers in conventional layer structures are held by holding structures extending substantially laterally of the two-dimensional layer which significantly increases the in-plane extension of a layer structure as compared to the mere in-plane extension of the two-dimensional layer. In addition, in conventional layer structures no means are provided for controlling the stress of a suspended two-dimensional layer which is crucial in some applications, e.g. in MEMS applications.

Conventional fabrication methods of layer structures having a two-dimensional layer usually include the transfer of two-dimensional layers grown on a growth structure using an intermediate carrier. These conventional methods are very complex and bear the risk of introducing defects in the two-dimensional layer that deteriorate its properties.

SUMMARY

According to one aspect of the present disclosure, a layer structure is provided. The layer structure may include a carrier, a two-dimensional layer, and a holding structure. The holding structure is arranged on the carrier and holds the two-dimensional layer on the carrier such that at least a portion of the two-dimensional layer is spaced apart from the carrier. The holding structure includes a holding portion extending from the two-dimensional layer towards the carrier beyond the at least a portion of the two-dimensional layer spaced apart from the carrier.

According to another aspect of the present disclosure, a layer structure is provided. The layer structure may include a carrier, a two-dimensional layer, and a holding structure. The holding structure is arranged on the carrier and holds the two-dimensional layer on the carrier such that at least a portion of the two-dimensional layer is spaced apart from the carrier. The holding structure includes at least two holding members being in physical contact with each other and having different thermal expansion characteristics.

According to yet another aspect of the present disclosure, a method of manufacturing a layer structure is provided. The method may include forming a two-dimensional layer on a carrier, forming a holding structure on the carrier and on a portion of the two-dimensional layer such that the holding structure is configured to hold the two-dimensional layer on the carrier, and removing a portion of the carrier at the interface to the two-dimensional layer to separate at least a portion of the two-dimensional layer from the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A and 3B show arrays including a plurality of layer structures according to the examples shown in FIGS. 1A, 1B and 2A, 2B;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "two-dimensional layer" used herein may relate to a layer a portion of which is made of a single atomic layer. This means that in this portion the two-dimensional layer has a thickness corresponding to the diameter of a single atom. The two-dimensional layer can be entirely made of a single atomic layer.

Figure 1A:
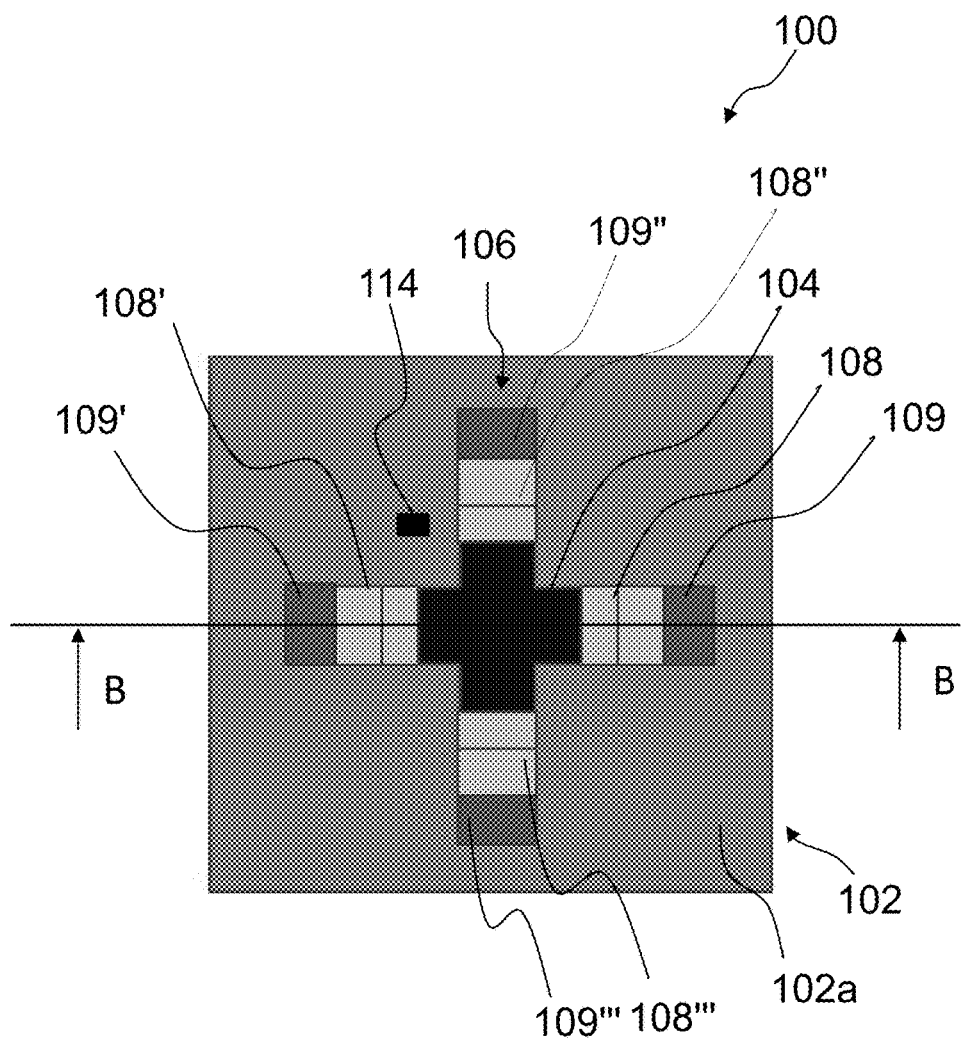
FIG. 1A shows a plan view of an exemplary layer structure including a two-dimensional layer.
Figure 1B:
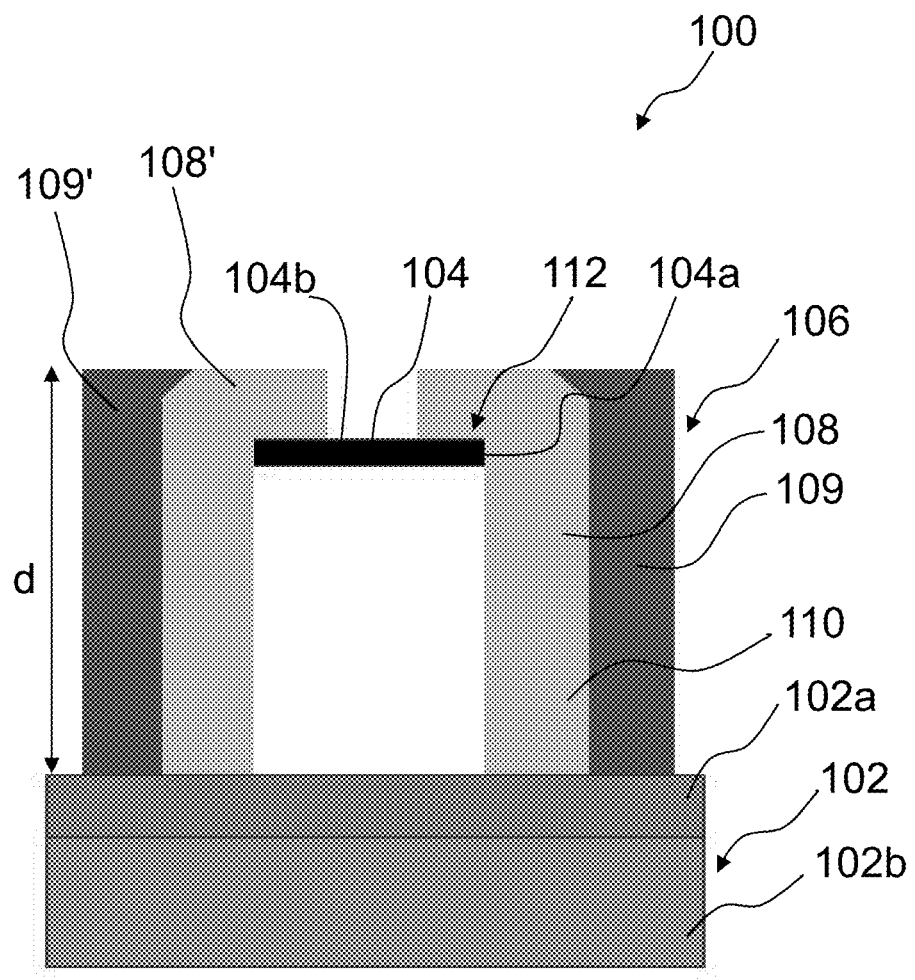
FIG. 1B shows a sectional view of the layer structure of FIG. 1A according to line B-B in FIG. 1A.

FIGS. 1A and 1B show a layer structure 100. The layer structure 100 may include a carrier 102, a two-dimensional layer 104, and a holding structure 106. As shown in FIG. 1B, the carrier 102 may include a plurality of carrier layers 102$a$, 102$b$ made of different materials. Suitable materials for the carrier layers 102$a$, 102$b$ may be materials having a melting point of above 800° C., such as $SiO_2$ or $Si_3N_4$.

The two-dimensional layer 104 may be made of a layer material including at least one of graphene, a graphene-related material, transition metal dichalcogenide, phosphorene, silicene, germanene, graphane, germanane, fluorographene, and fluorographane. The graphene-related material may include 2D molybdenum sulphide, tungsten disulphide, and tungsten diselenide, and the like. Any other suitable material forming a two-dimensional layer may be provided in alternative implementations.

The holding structure 106 is arranged on the carrier 102 and holds the two-dimensional layer 104 such that the two-dimensional layer 104 is spaced apart from the carrier 102. Although the two-dimensional layer 104 of the layer structure 100 shown in FIG. 1B is entirely spaced apart from the carrier 102, layer structures according to various embodiments are conceivable having a two-dimensional layer that is only partially spaced apart from a respective carrier, while a portion of the two-dimensional layer is in physical contact with the carrier.

The holding structure 106 may include a plurality of holding pillars 108, 108', 108'', 108''' positioned at different sides of the two-dimensional layer 104, as is shown in FIG. 1A. Since the holding pillars 108, 108', 108'', 108''' may have identical structures, in the subsequent description, reference will be made only to one of the pillars shown in FIGS. 1A and 1B, e.g. to the holding pillar 108. Even though the layer structure 100 shown in FIGS. 1A and 1B includes a plurality of holding pillars 108, 108', 108'', 108''', layer structures including only a single holding pillar are also conceivable.

As shown in FIG. 1B, the holding pillar 108 may include a holding portion 110 extending beyond the two-dimensional layer 104 towards the carrier 102, and a contact portion 112 contacting the two-dimensional layer 104. The holding portion 110 may be, as shown in FIG. 1B, in physical contact with the carrier 102.

The contact portion 112 of the holding pillar 108 may be configured as an angled portion contacting both an outer circumferential portion 104a of the two-dimensional layer 104 and a surface 104b of the two-dimensional layer 104 facing away from the carrier 102. By the provision of an angled contact portion 112, the two-dimensional layer 104 can be reliably kept in a spaced-apart relationship relative to the carrier 102 and can be efficiently protected from external influences by the holding pillar 108.

The holding pillar 108 may be made, at least partially, from an electrically conductive material, e.g. from a metal such as copper or aluminum. In this way, the two-dimensional layer 104 can be electrically contacted via the holding pillar 108. Hence, no further contacting structure for electrically contacting the two-dimensional layer 104 are required, providing a simple and compact layer structure 100 in this way. As indicated in FIG. 1B, the holding pillar 108 may be formed in one piece.

The provision of a holding pillar 108 having a holding portion 110 extending beyond the two-dimensional layer 104 towards the carrier 102 provides the opportunity of influencing the dimensions of the layer structure 100 in a direction pointing away from the carrier 102.

The holding pillar 108 may have a dimension d in a direction pointing away from the carrier 102 from about 500 nm to about 50 µm. In one example, the holding pillar 108 may have a dimension "d" in a direction pointing away from the carrier 102 in the range from about 4 µm to about 20 µm. In another example, the holding pillar 108 may have a dimension "d" in a direction pointing away from the carrier 102 in the range from about 5 µm to about 10 µm. The two-dimensional membrane may have a diameter of at least 60 µm.

The ratio of the diameter of the two-dimensional layer 104 and the dimension "d" of the holding pillar 108 in a direction pointing away from the carrier 102 may be maximum 20:1, e. g. maximum 10:1.

The holding pillar 108 may be formed as a first holding member being in physical contact with a second holding member 109 that has thermal expansion characteristics different from those of the holding pillar 108. Each of the other holding pillars 108', 108'', 108''' shown in FIGS. 1A and 1B may be formed as first holding members being in physical contact with respective second holding members 109', 109'', 109''' having different thermal expansion characteristics. Since the second holding members 109, 109', 109'', 109''' may be identical, reference will be made only to the second holding member 109 in the following description.

Changing the temperature of the first and second holding members 108, 109 leads to a respective deformation of the holding members 108, 109 due to the different thermal expansion characteristics, similar to a bimetal strip. In this way, the stress of the two-dimensional layer 104 can be efficiently influenced by the holding members 108, 109.

As shown in the FIGS. 1A and 1B, the first and second holding members 108, 109 can be in physical contact with each other along mutually complementary surfaces. In this way, a reliable physical contact between the holding members 108, 109 can be ensured. The first and second holding members 108, 109 can be in physical contact at a side of the first holding member 108, i.e. of the holding pillar 108, facing away from the two-dimensional layer 104. In this way, bending of the first and second holding members 108, 109 induced by a temperature change efficiently exerts a tensile or compressive stress onto the two-dimensional layer 104, facilitating a highly efficient control of the stress state of the two-dimensional layer 104.

At least one of the holding members 108, 109 may be made of an electrically conductive material. In this way, by conducting a defined electrical current through the respective holding member 108, 109 a defined temperature rise can be induced leading to a defined deformation of the individual holding members 108, 109. This may enable a precise control of the stress state of the two-dimensional layer 104. Alternatively or additionally, a heater 114 separate from the holding members 108, 109 may be provided. In this way, the thermal and the electrical state of the two-dimensional layer 104 can be controlled independently from each other. As shown in FIG. 1A, the heater 114 may be positioned on a surface of the carrier 102 on which the holding structure 106 is provided.

Although a single heater 114 is provided in FIG. 1A, layer structures including a plurality of heaters 114 are also conceivable.

As further shown in FIG. 1B, the holding members 108, 109 may be co-extensive in a direction pointing away from the carrier 102. The holding members 108, 109 may have co-planar end faces at a side facing away from the carrier 102. In this way, a layer structure 100 with a well-defined dimension in a direction pointing away from the carrier 102 may be provided. This configuration simplifies an integration of the layer structure 100 into a device.

Figure 2A:
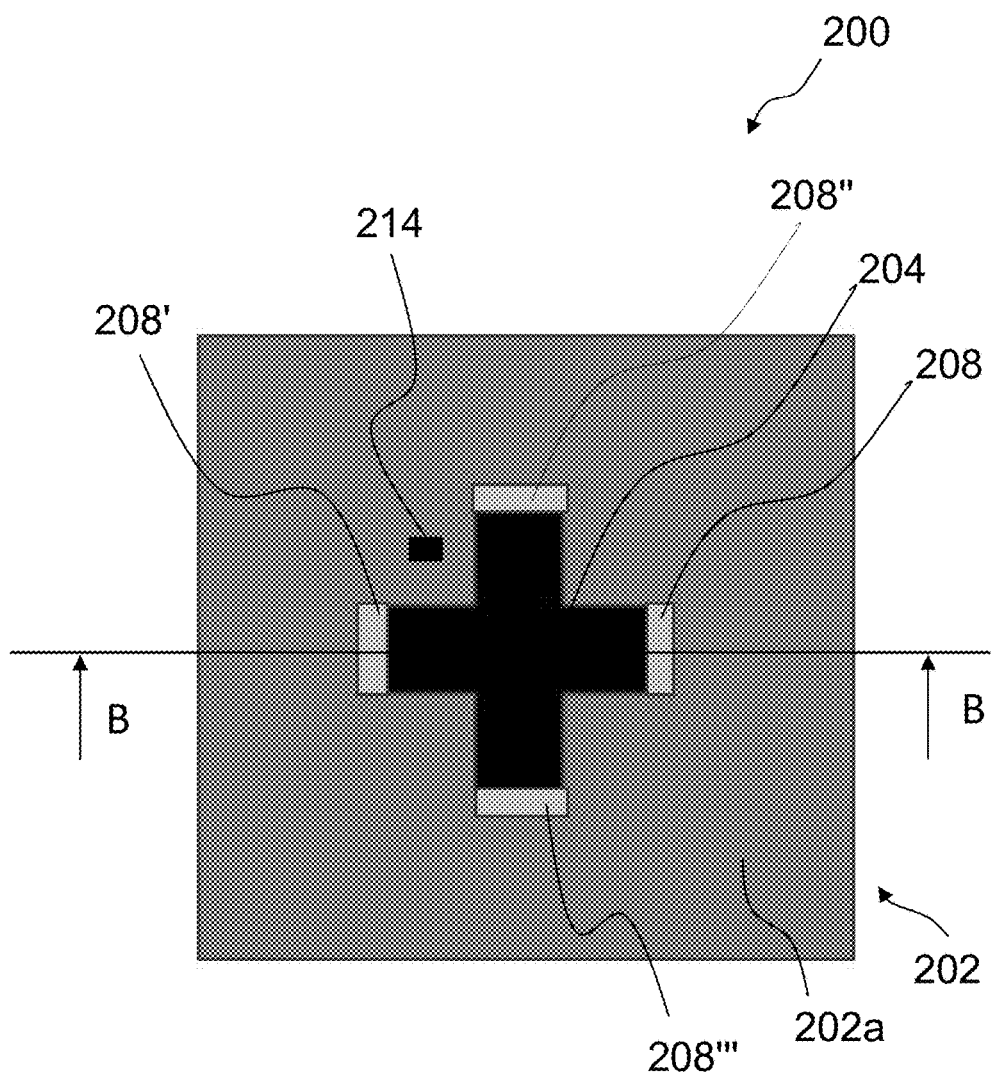
FIG. 2A shows a plan view of another exemplary layer structure including a two-dimensional layer.
Figure 2B:
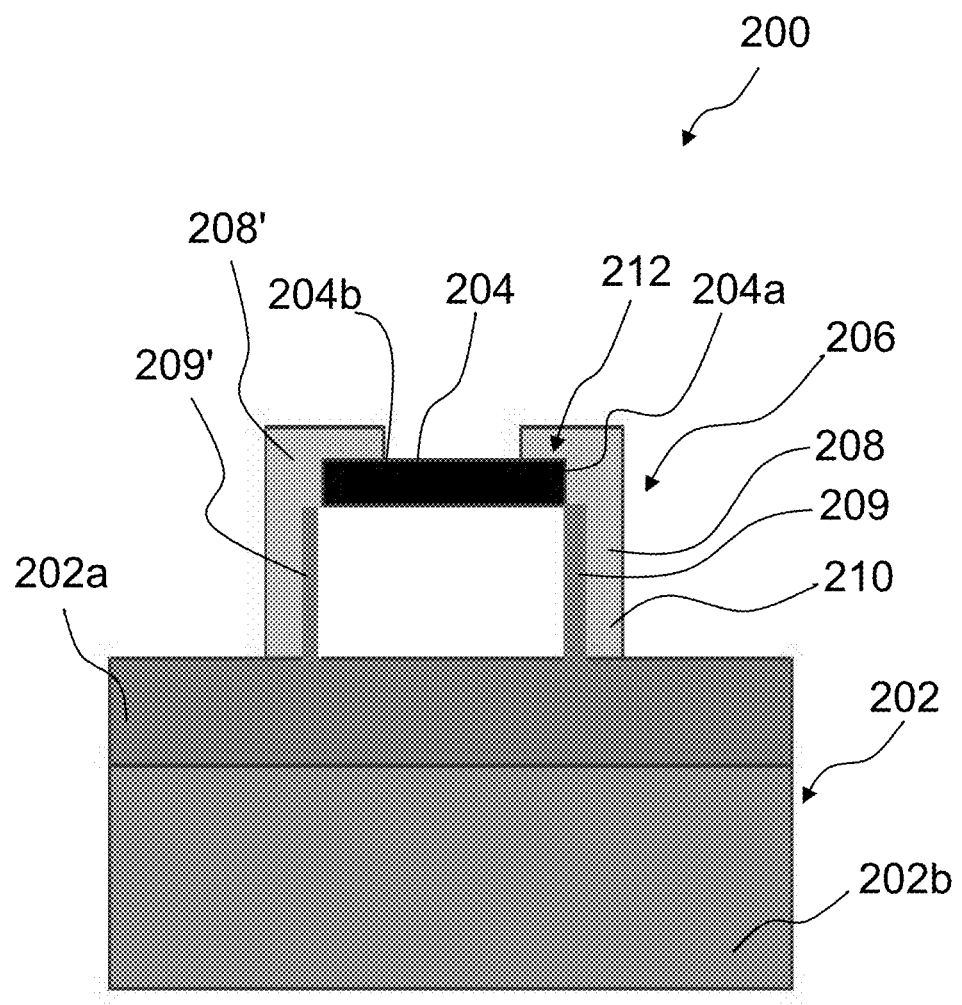
FIG. 2B shows a sectional view of the layer structure of FIG. 2A according to line B-B in FIG. 2A.

FIGS. 2A and 2B show another example of a layer structure 200. Elements of the layer structure 200 corresponding to elements of the layer structure 100 are provided with the same reference numerals, however enhanced by the number 100. The layer structure 200 will be described only inasmuch as it differs from the layer structure 100 shown in FIGS. 1A and 1B.

The layer structure 200 shown in FIGS. 2A and 2B differs from the layer structure 100 shown in FIGS. 1A and 1B in view of the configuration of the holding members 208, 209, 208', 209', 208'', 209'', 208''', 209'''. In the following description of the differences between the layer structures 100 and 200, reference will be made only to the first and second holding members 208, 209. The subsequently discussed differences may also apply to the other holding members 208', 209', 208'', 209'', 208''', 209'''.

As indicated in FIG. 2B, the holding members 208, 209 of the layer structure 200 differ from the holding members 108, 109 in that they are in physical contact with each other along a surface of the first holding member 208 facing towards the two-dimensional layer 204. In addition, the second holding member 209 is made of the material of the carrier 202. As shown in FIG. 2B, the second holding member 209 may be integrally formed with the carrier 202, e.g. with an upper layer 202a in case the carrier 202 includes a plurality of layers 202a, 202b, as shown in FIG. 2B.

Even though in the above examples the respective holding pillars 108, 108', 108'', 108''' and 208, 208', 208'', 208''' are configured as first holding members being in physical contact with a respective second holding member, the embodiments are not limited to this configuration. Instead, layer structures according to various embodiments are also conceivable that include first and second holding members that do not protrude beyond the two-dimensional layer towards the respective carrier. In addition, holding pillars are conceivable that are not configured as first holding members.

FIGS. 3A and 3B show arrays 300, 400 respectively including a plurality of layer structures 100, 200 described above with reference to the FIGS. 1A, 1B, 2A, and 2B. Even though the array 300 shown in FIG. 3A is depicted to include only layer structures 100 shown in FIGS. 1A and 1B and the array 400 is depicted to include only layer structures 200 shown in FIGS. 2A and 2B, arrays including different types of layer structures, e.g. both of the above-described layer structures 100 and 200 are also conceivable.

Layer structures including a holding portion extending beyond a two-dimensional layer spaced apart from a respective carrier allow a reduction of the in-plane extension of the layer structure compared to layer structures that do not include holding portions. In this way, arrays with a high layer structure packing density can be provided.

Figure 4:
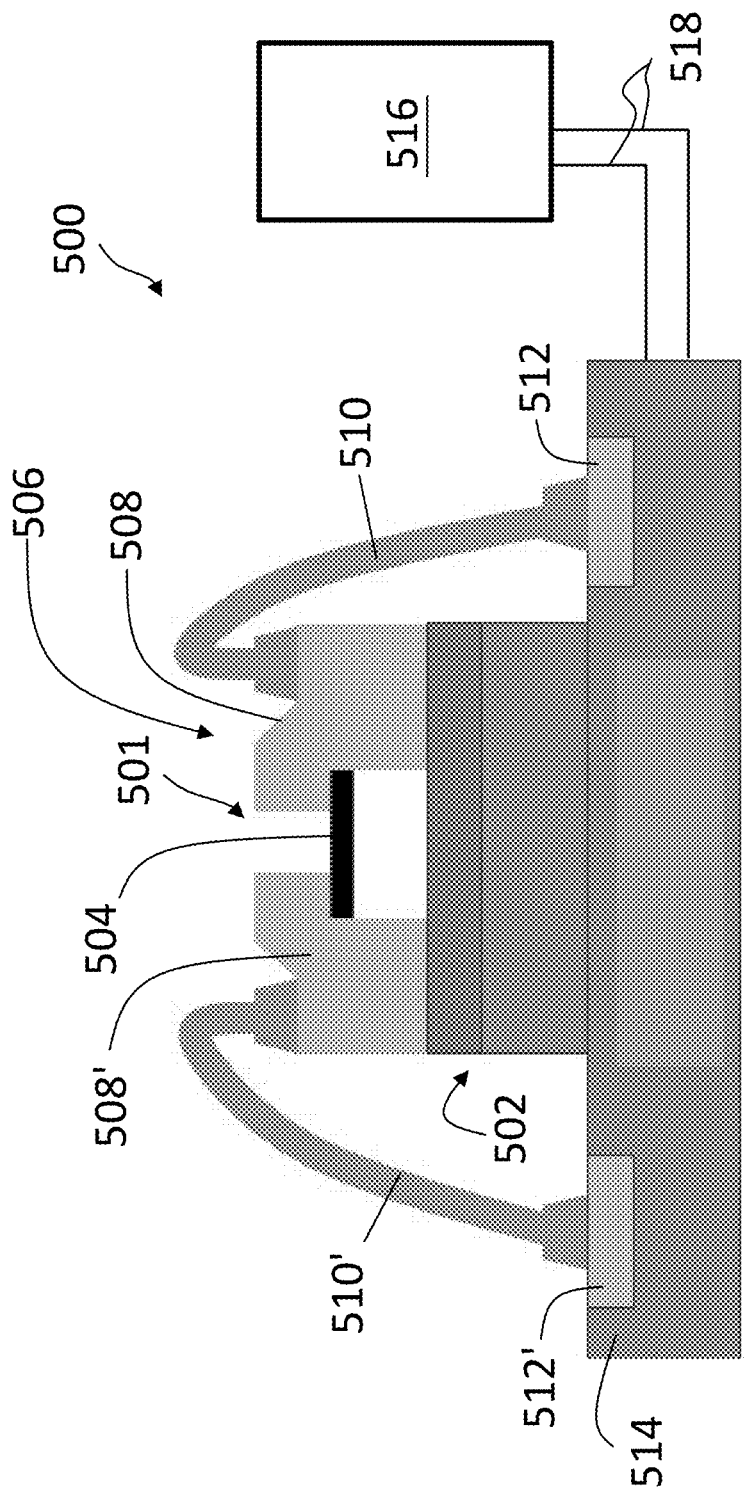
FIG. 4 shows an electronic device including a layer structure according to the present disclosure.

FIG. 4 shows a device 500. The device may include a layer structure 501 according to various embodiments. The layer structure 501 may include a carrier 502, a two-dimensional layer 504 and a holding structure 506. The holding structure 506 may include a plurality of holding pillars 508, 508' similar to the layer structures 100, 200 described above. However, in contrast to the above layer structures 100, 200, the holding pillars 508, 508' are not configured as first holding members, i.e. they are not in physical contact with a second holding member having different thermal expansion characteristics. The layer structure 501 shown in FIG. 4, however, may be replaced by one of the layer structures 100, 200 described above or even by an array including a plurality of layer structures 100, 200 such as the arrays 300, 400 described above.

The holding pillars 508, 508' of the layer structure 501 shown in FIG. 4 may be made of an electrically conductive material such as copper or aluminum and may be electrically contacted by contact wires 510, 510' providing an electrical contact with pads 512, 512' provided on a device carrier 514.

The device 500 may further include an electronic circuit 516 coupled with the layer structure 501 via lines 518 to detect an electrical signal from the two-dimensional layer 504.

The device 500 may be configured as a sensor, such as a microphone or a Hall sensor. Alternatively, the device 500 may be configured as an actor such as a loudspeaker.

Figure 5:
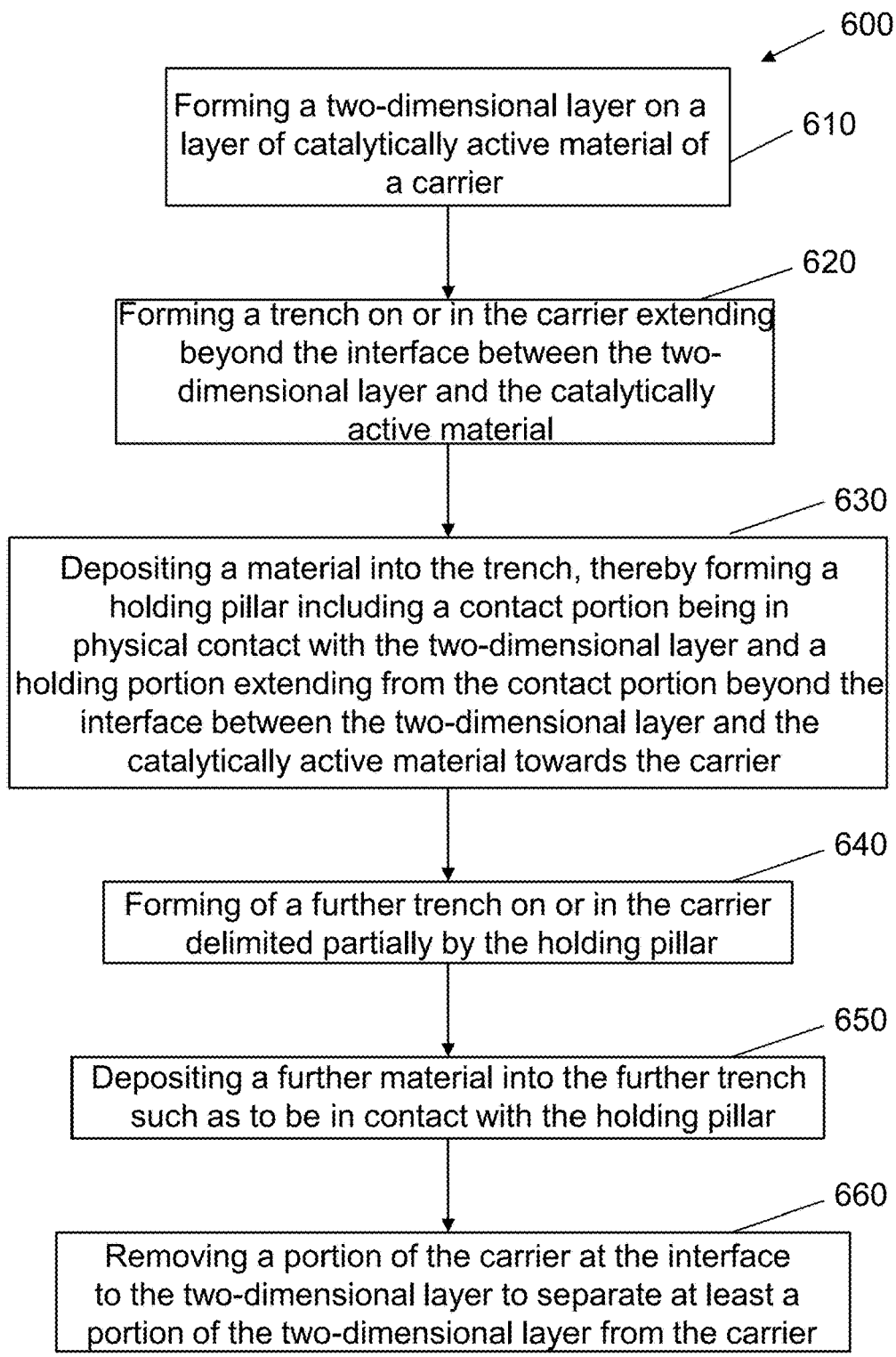
FIG. 5 shows a flow diagram illustrating an exemplary method of fabricating a layer structure.

FIG. 5 shows a flow diagram of an exemplary method 600 of manufacturing a layer structure, e. g. the layer structure shown in FIGS. 1A and 1B.

Method 600 may include:

forming a two-dimensional layer on a layer of a catalytically active material of a carrier (610), forming a trench on or in the carrier extending beyond the interface between the two-dimensional layer and the catalytically active material (620), depositing a material into the trench, thereby forming a holding pillar including a contact portion being in physical contact with the two-dimensional layer and a holding portion extending from the contact portion beyond the interface between the two-dimensional layer and the catalytically active material towards the carrier (630), forming a further trench on or in the carrier delimited partially by the holding pillar (640), depositing a further material into the further trench such as to be in contact with the holding pillar (650), and removing a portion of the carrier at the interface to the two-dimensional layer to separate at least a portion of the two-dimensional layer to separate at least a portion of the two-dimensional layer from the carrier (660).

In the following, the method 600 of FIG. 5 will be explained in more detail with reference to FIGS. 6A to 17B. In these figures, those figures denominated by a suffix "A" show a plan view of the carrier 102 at different manufacturing stages, while those figures denominated by a suffix "B" show a sectional view of the substrate 102 according to line B-B in the respective plan view.

Figure 6A:
FIGS. 6A to 17B illustrate details of the exemplary method of FIG. 5.
Figure 6B:
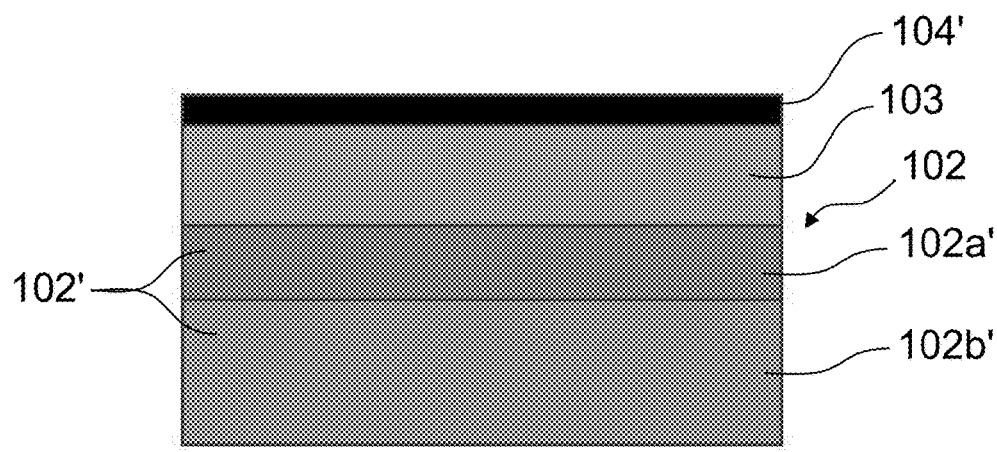

A carrier 102 with a two-dimensional layer 104' formed thereon is shown in FIGS. 6A and 6B.

The carrier 102 may include a base carrier 102' and a layer 103 of catalytically active material at a surface of the base carrier 102'. The forming of the two-dimensional layer 104' on the carrier 102 may include depositing of at least one material selected from graphene, molybdenum sulphide, tungsten disulphide, tungsten diselenide, transition metal dichalcogenide, phosphorene, silicone, germanene, graphane, germanane, fluorographene, and fluorographane onto the layer 103 of catalytically active material, e.g. by chemical vapor deposition (CVD).

The base carrier 102' may include a plurality of base carrier layers 102a', 102b' made of materials with a melting point of above 800° C. such as $SiO_2$ or $Si_3N_4$. The layer 103 of catalytically active material may include materials such as copper, platinum, iridium, nickel, iron, manganese or palladium.

Figure 7A:
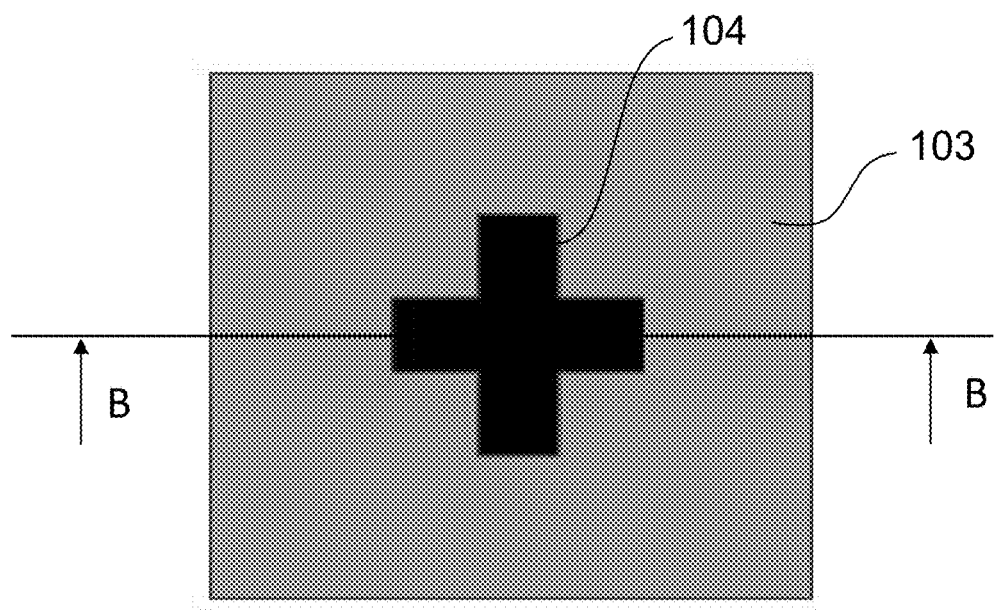
Figure 7B:
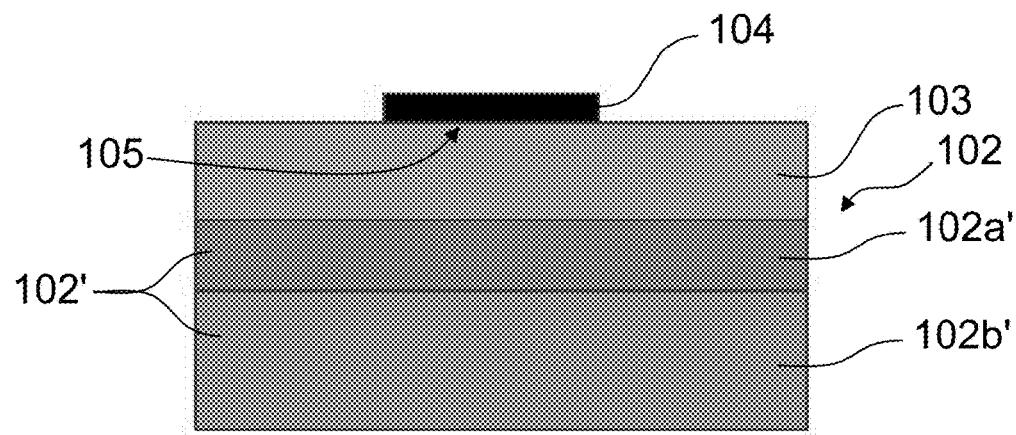

After forming the two-dimensional layer 104', the method may include structuring the two-dimensional layer 104' to provide a two-dimensional layer 104 with a desired shape, e.g. a Hall cross, as illustrated in FIGS. 7A and 7B.

The method may further include forming a holding structure 106 on the carrier 102 and on a portion of the two-dimensional layer 104 such that the holding structure 106 is configured to hold the two-dimensional layer 104 on the carrier 102.

Figure 8A:
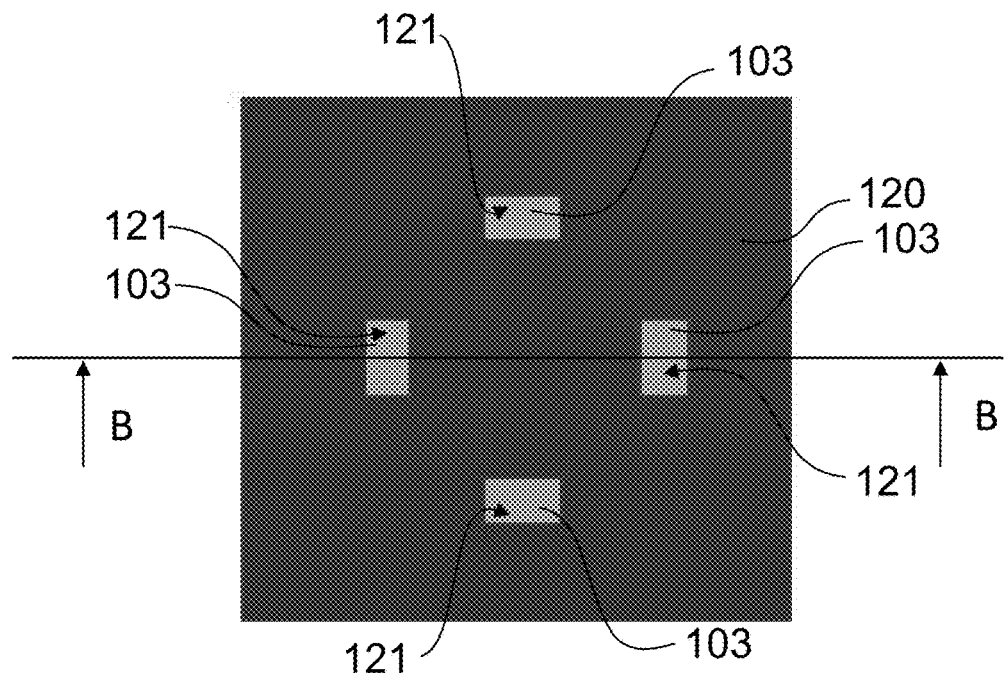
Figure 8B:
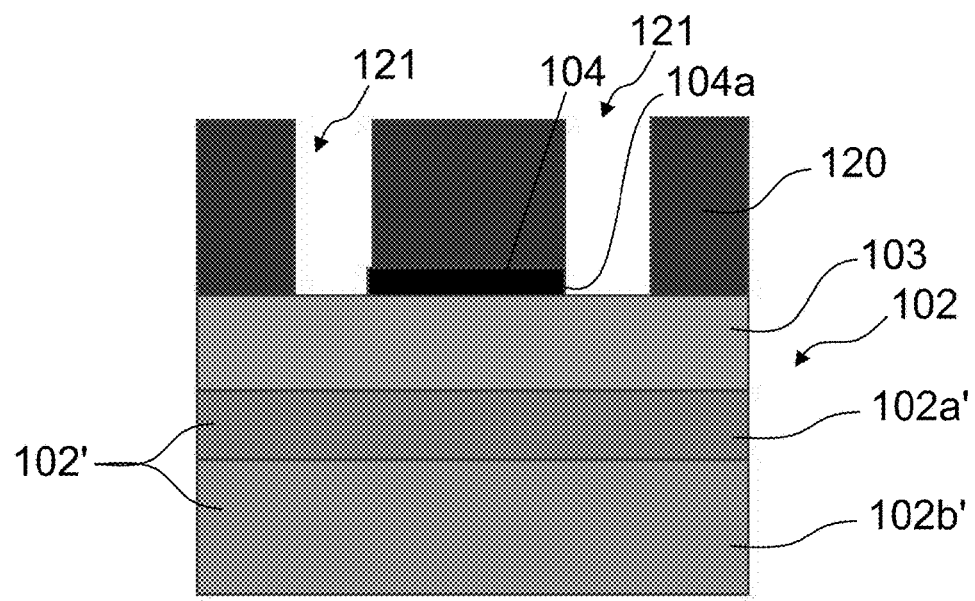

The forming of the holding structure 106 may include, as indicated in FIGS. 8A and 8B, forming of a trench in or on the carrier 102. The forming of a trench may include depositing a layer 120 of sacrificial material such as photoresist onto the layer 103 of catalytically active material and onto the two-dimensional layer 104, and photolithographically defining an area or a plurality of distinct areas on the layer 120 of sacrificial material. Subsequently, in these areas the sacrificial material is removed down to the surface of the layer 103 of catalytically active material, e. g. by a solvent such as acetone, thereby exposing a portion of the upper surface of the layer 103 of catalytically active material and an outer circumferential portion 104a of the two-dimensional layer 104. In this way, a trench 121 is formed that extends from the surface of the layer 103 of catalytically active material beyond the two-dimensional layer 104 in a direction pointing away from the carrier 102.

Figure 9A:
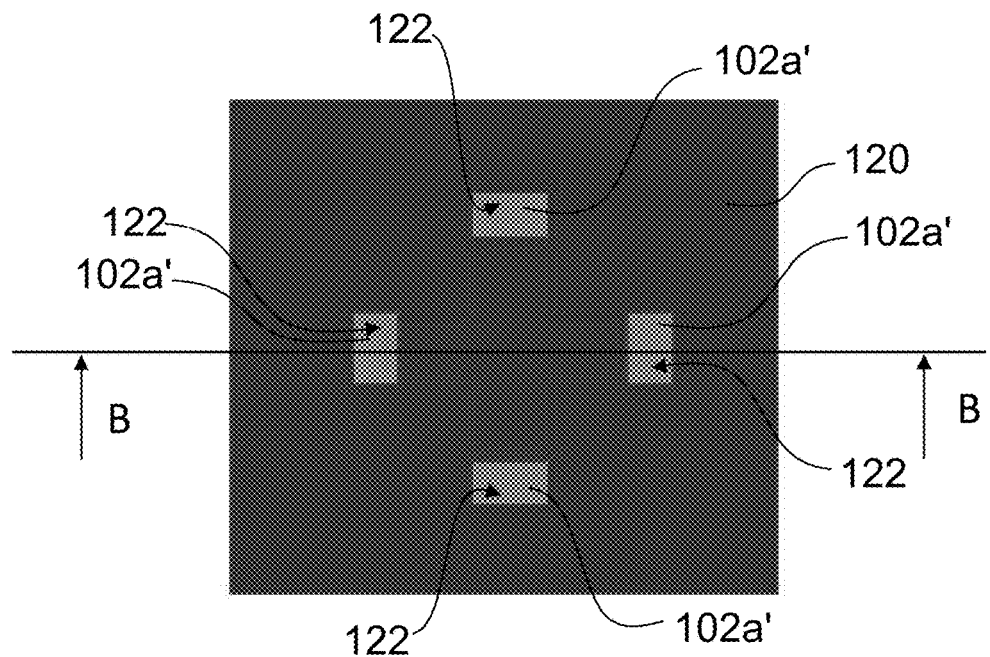
Figure 9B:
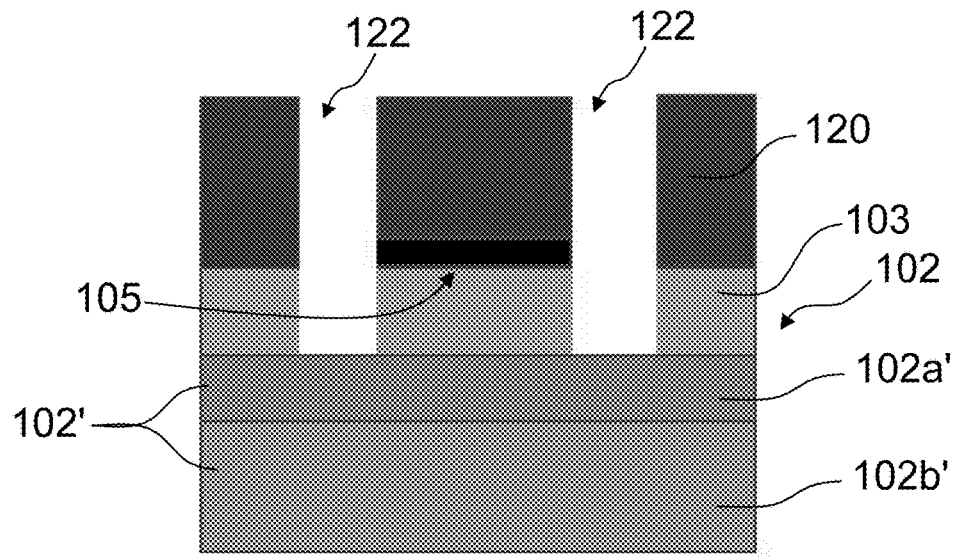

Subsequently, as indicated in FIGS. 9A and 9B, the catalytically active material is removed in the areas of the trenches 121 down to the surface of the base carrier 102' located adjacently below the layer 103 of catalytically active material, e. g. by etching, thereby extending the trenches 121 formed in the layer 120 of sacrificial material beyond the interface 105 between the two-dimensional layer 104 and the layer 103 of catalytically active material. In this way trenches 122 are formed that extend both beyond the interface 105 between the two-dimensional layer 104 and the layer 103 of catalytically active material towards the base carrier 102' and beyond the two-dimensional layer 104 in a direction pointing away from the carrier 102. The base carrier 102' may include a layer 102a' made of an etch-resistant material in order to accurately define the depth of the trenches 122 in the carrier 102.

The dimension of the portion of the trench 122 that extends in the layer 103 of catalytically active material may be larger than a diameter of the two-dimensional layer 104.

Figure 10A:
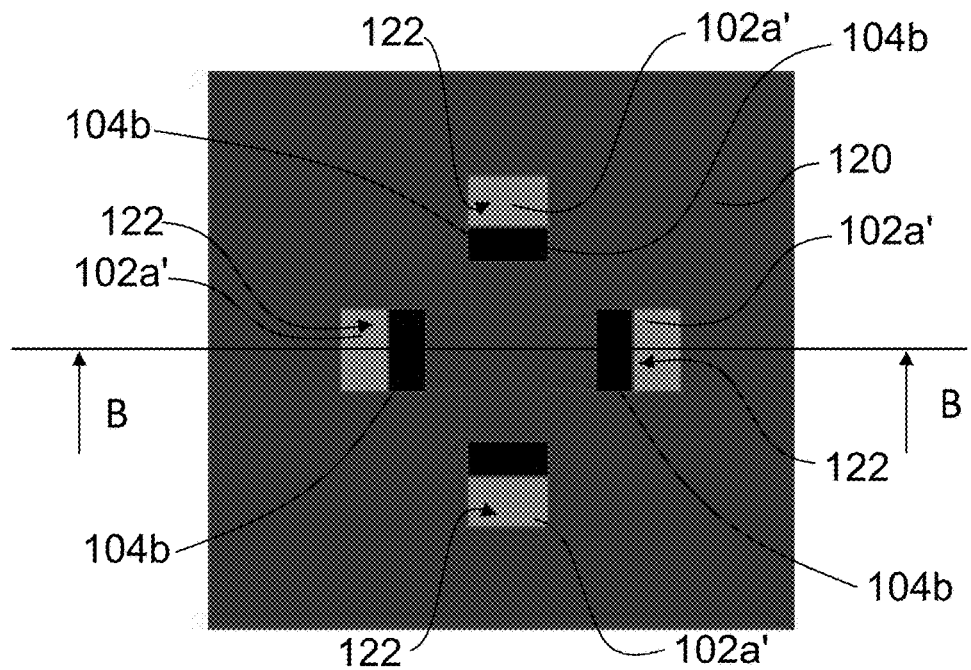
Figure 10B:
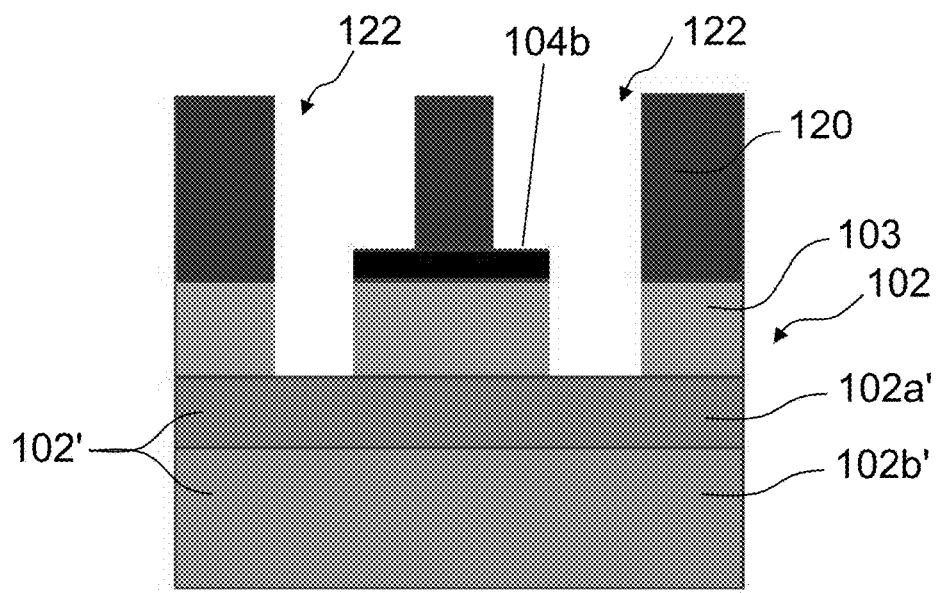

The method may further include removing part of the sacrificial material of the layer 120 of sacrificial material to expose a portion of a surface 104b of the two-dimensional layer 104 facing away from the carrier 102, as shown in FIGS. 10A and 10B. In this way, the trenches 122 may be partially extended over the surface 104b of the two-dimensional layer 104 facing away from the carrier 102. Hence, the thus formed trench 122 are partially delimited by both an outer circumferential portion 104a and a portion of the surface 104b of the two-dimensional layer 104 facing away from the carrier 102.

Figure 11A:
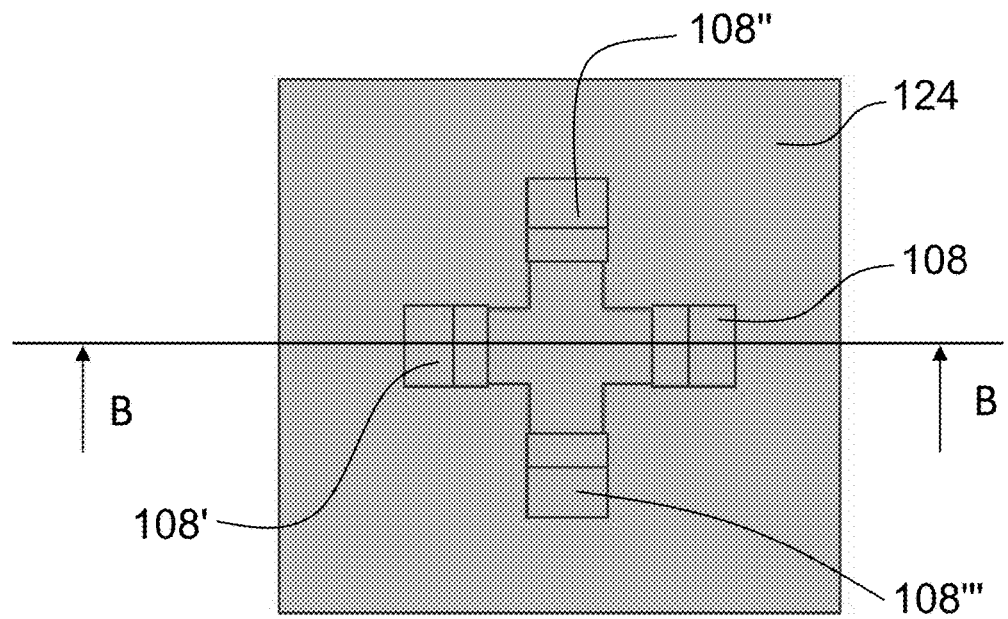
Figure 11B:
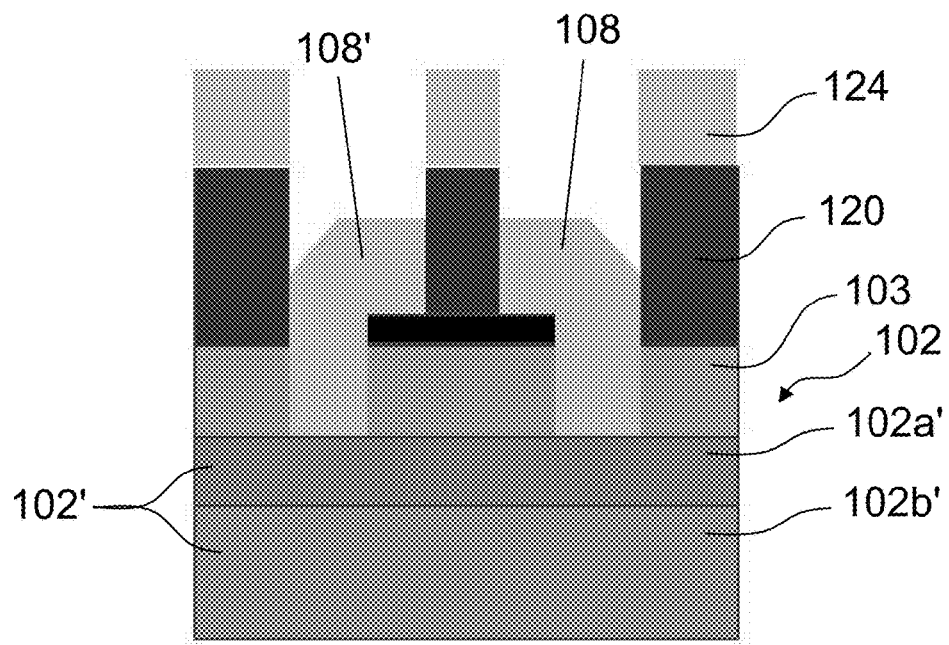

As shown in FIGS. 11A and 11B, the forming of the holding structure 106 may further include depositing a material into the trenches 122, thereby forming holding pillars 108, 108', 108'', 108''' including a contact portion 112 being in physical contact with the two-dimensional layer 104 and a holding portion 110 extending from the contact portion 112 beyond the interface 105 between the two-dimensional layer 104 and the layer 103 of catalytically active material towards the base carrier 102'.

It should be noted that during the deposition of material into the trenches 122, a layer 124 of this material may be deposited also onto the layer 120 of sacrificial material, as shown in FIGS. 11A and 11B. This layer 124 may subsequently be removed by removing the layer 120 of sacrificial material, e. g. by a solvent such as acetone (cf. FIGS. 12A and 12B).

The material deposited into the trenches 122 may include an electrically conductive material, e. g. a metal such as aluminum or copper.

Figure 12A:
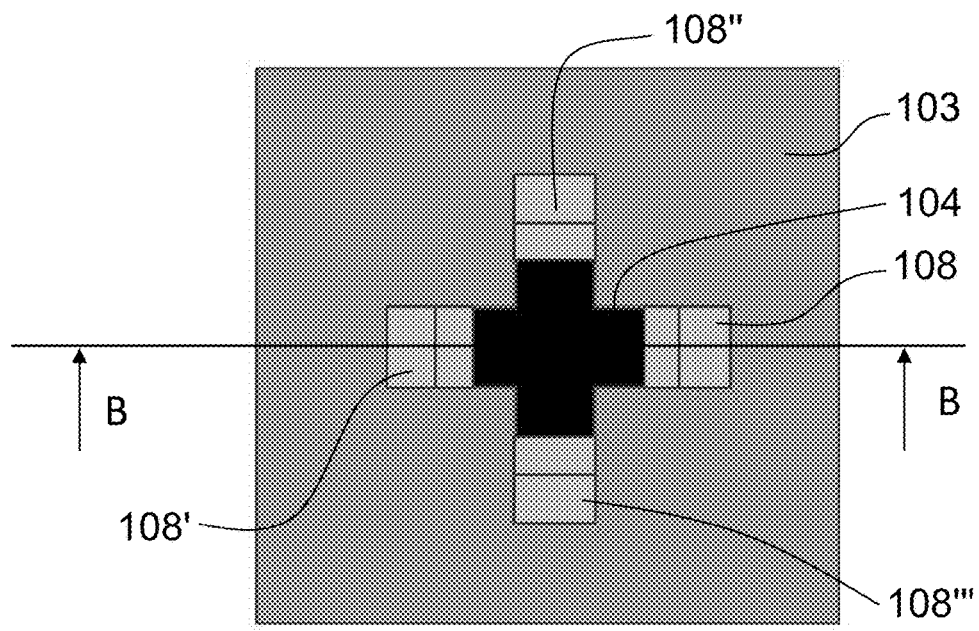
Figure 12B:
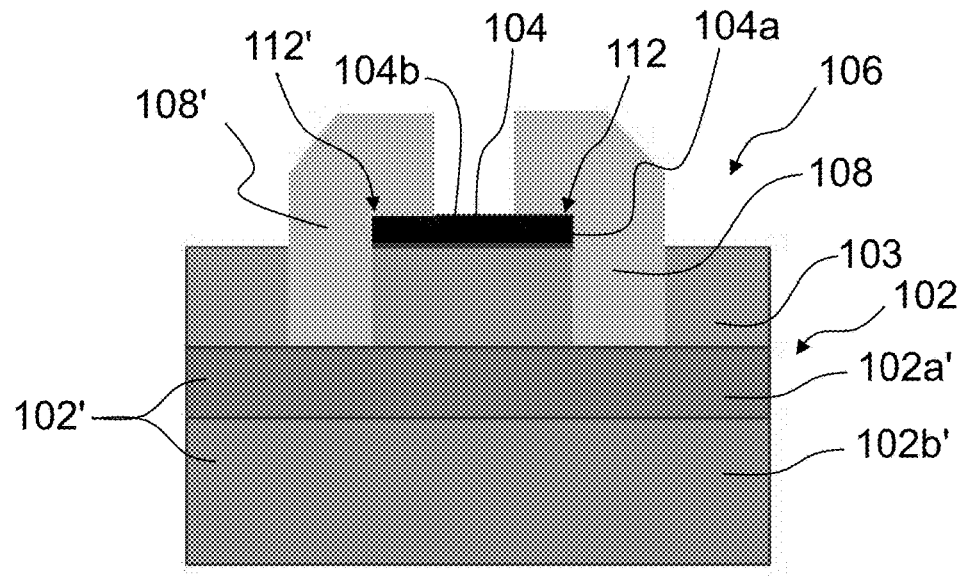

As shown in FIG. 12B, the contact portions 112, 112' of the holding pillars 108, 108' physically contact both an outer circumferential portion 104a of the two-dimensional layer 104 and a surface 104b of the two-dimensional layer 104 facing away from the carrier 102. This may also apply to the other holding pillars 108'', 108''' not shown in FIG. 12B.

The method may further include removing a portion of the carrier 102 at the interface 105 to the two-dimensional layer 104 to separate at least a portion of the two-dimensional layer 104 from the carrier 102.

Figure 13A:
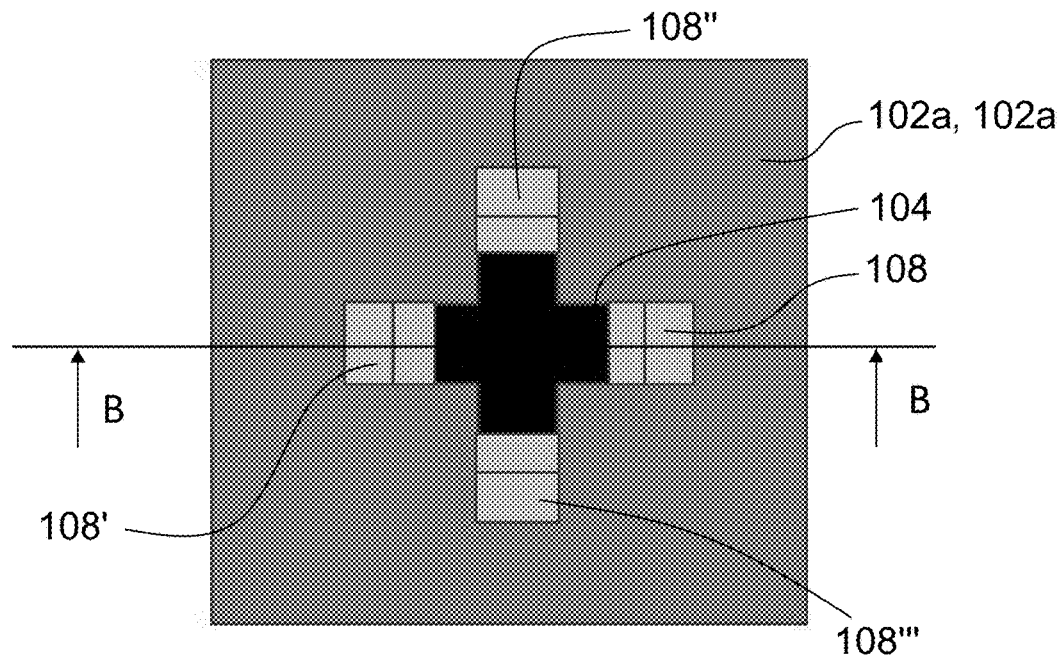
Figure 13B:
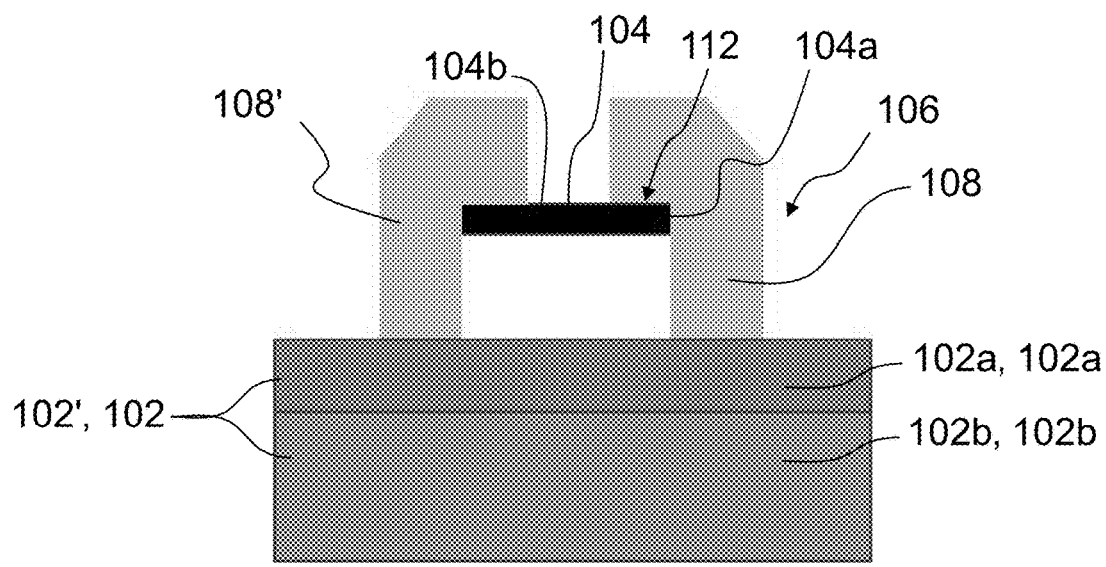

More specifically, as shown in FIGS. 13A and 13B, the removing of the carrier 102 may include removing at least a part of the layer 103 of catalytically active material, or even the entire layer 103 of catalytically active material. In this way, at least a portion or even the entire two-dimensional layer 104 can be separated from the carrier 102. It should be noted that after the removal of the layer 103 of catalytically active material, the base carrier 102' may be identical to the carrier 102, as shown in FIGS. 13A and 13B.

The layer structure shown in FIGS. 13A and 13B basically corresponds to the layer structure 501 of the device 500 shown in FIG. 4. This means that the individual holding pillars 108, 108', 108'', 108''' are not configured as first holding members being in physical contact with respective second holding members having thermal expansion characteristics different from those of the holding pillars 108, 108', 108'', 108'''.

In order to manufacture a layer structure 100 including holding members, e. g. the layer structure 100 shown in FIGS. 1A and 1B, the method may further include, starting from the configuration shown in FIGS. 12A and 12B, forming second holding members being in physical contact with the holding pillars 108, 108', 108'', 108''' prior to removing the layer 103 of catalytically active material.

Figure 14A:
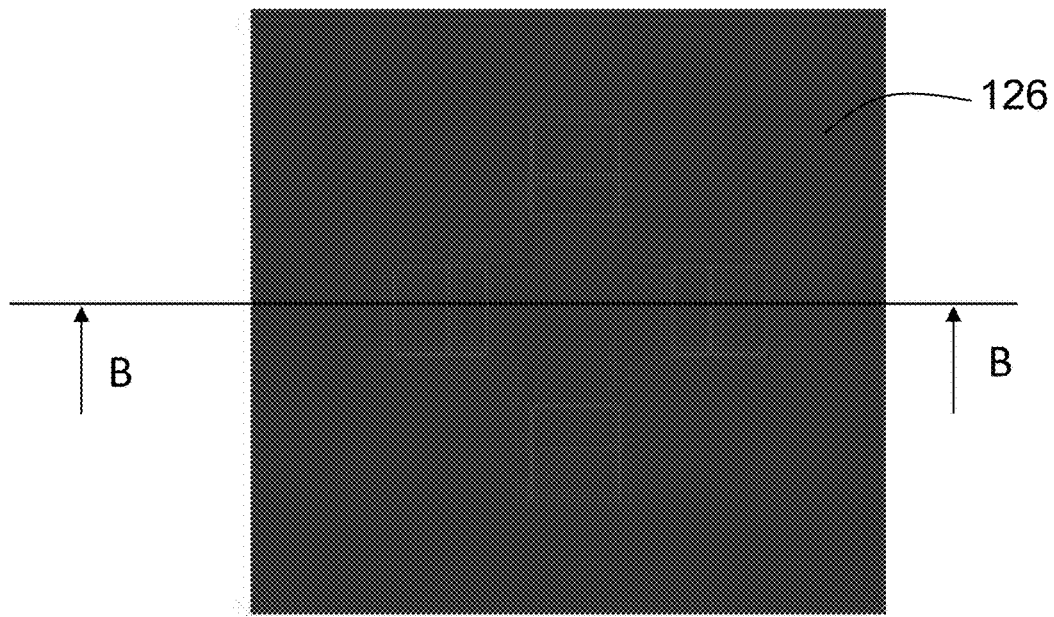
Figure 14B:
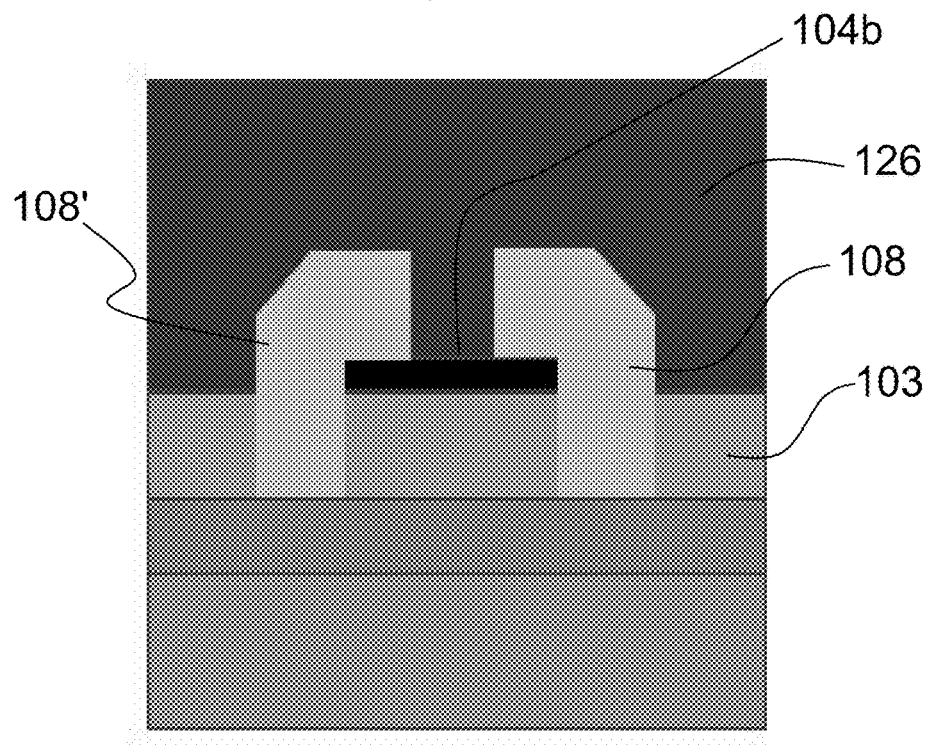

As shown in FIGS. 14A and 14B, the forming of the second holding members may include forming of further trenches on or in the carrier 102 delimited partially by the holding pillars 108, 108', 108'', 108'''.

The forming of the further trenches may include, as indicated in FIGS. 14A and 14B, depositing a further layer 126 of sacrificial material such as photoresist onto the layer 103 of catalytically active material, onto a part of the holding pillars 108, 108', 108'', 108''' and onto the surface 104b of the two-dimensional layer 104 facing away from the carrier 102, and photolithographically defining an area or several distinct areas on the further layer 126 of sacrificial material adjacent the holding pillars 108, 108', 108'', 108''' in which the sacrificial material is then removed down to the surface of the layer 103 of catalytically active material, e. g. by a solvent such as acetone.

Figure 15A:
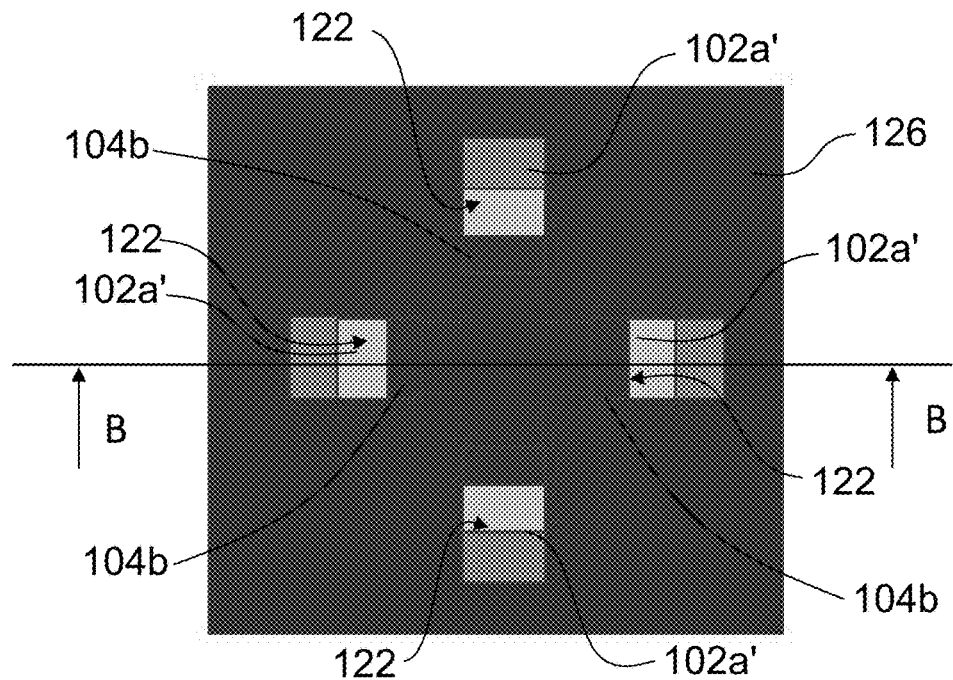
Figure 15B:
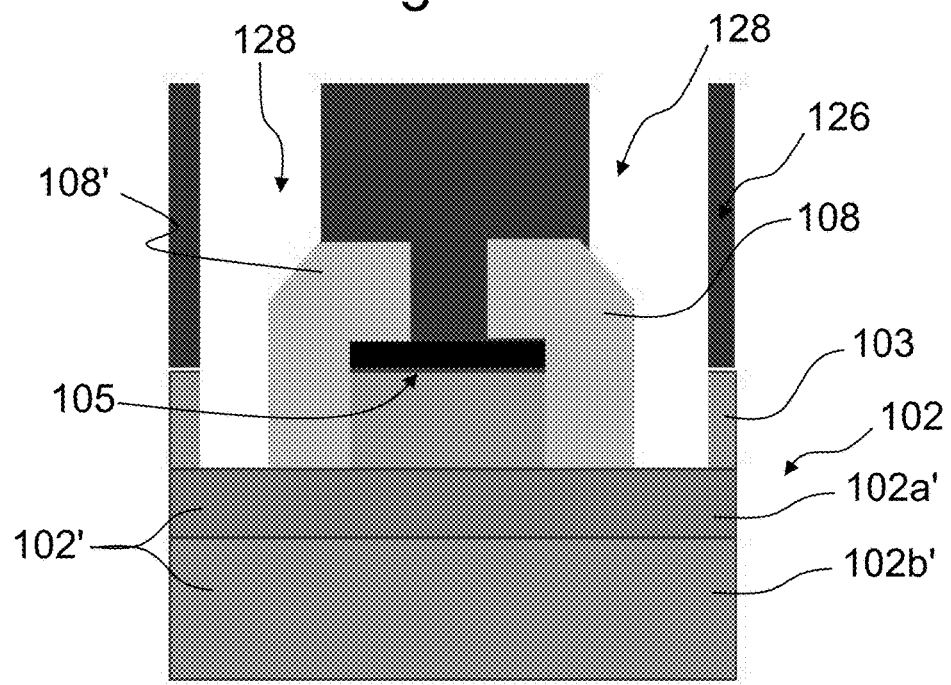

Subsequently, as shown in FIGS. 15A and 15B, the catalytically active material is removed in the areas of the trenches formed in the layer 126 of sacrificial material down to the surface of the base carrier 102' located adjacently below the layer 103 of catalytically active material, e. g. by etching, thereby forming trenches 128 that extend both beyond the interface 105 between the two-dimensional layer 104 and the layer 103 of catalytically active material in the carrier 102 and beyond the two-dimensional layer 104 in a direction pointing away from the carrier 102. The base carrier 102' may include below the layer 103 of catalytically active material an etch-resistant layer 102a' in order to accurately define the depth of the trenches 128 in the carrier 102.

Figure 16A:
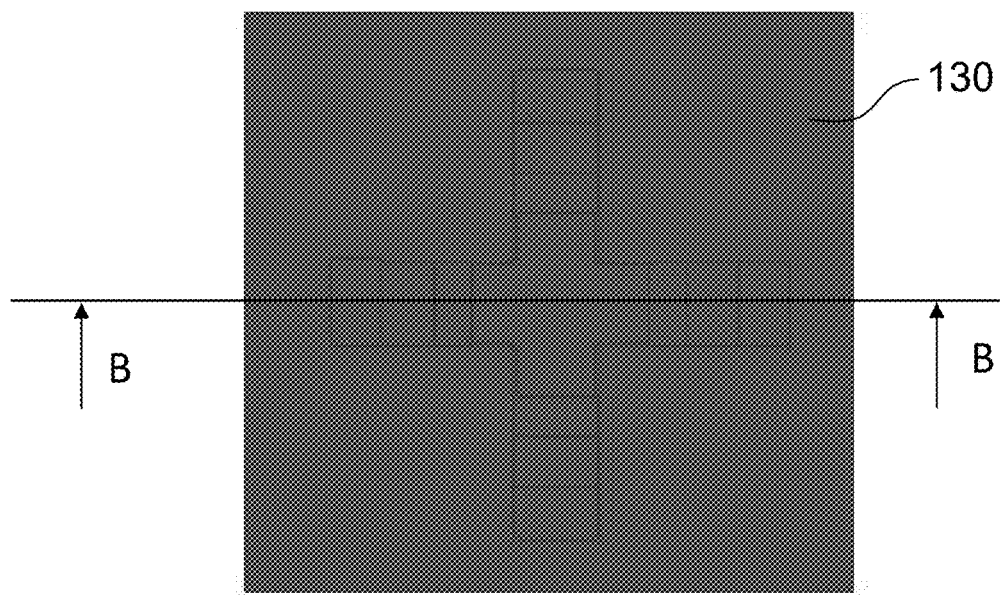
Figure 16B:
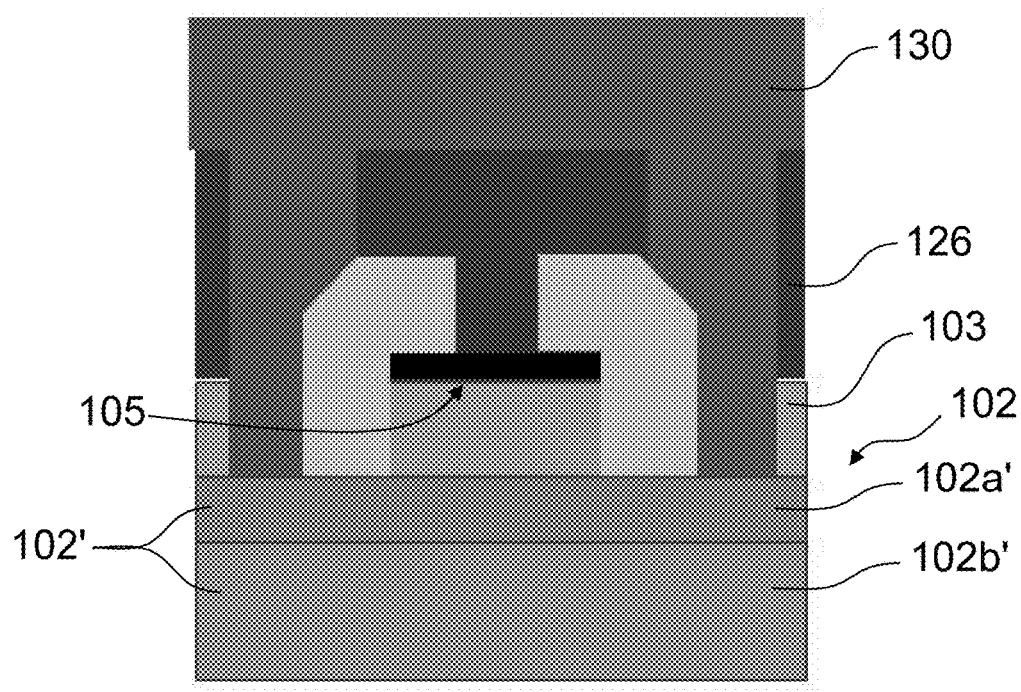
Figure 17A:
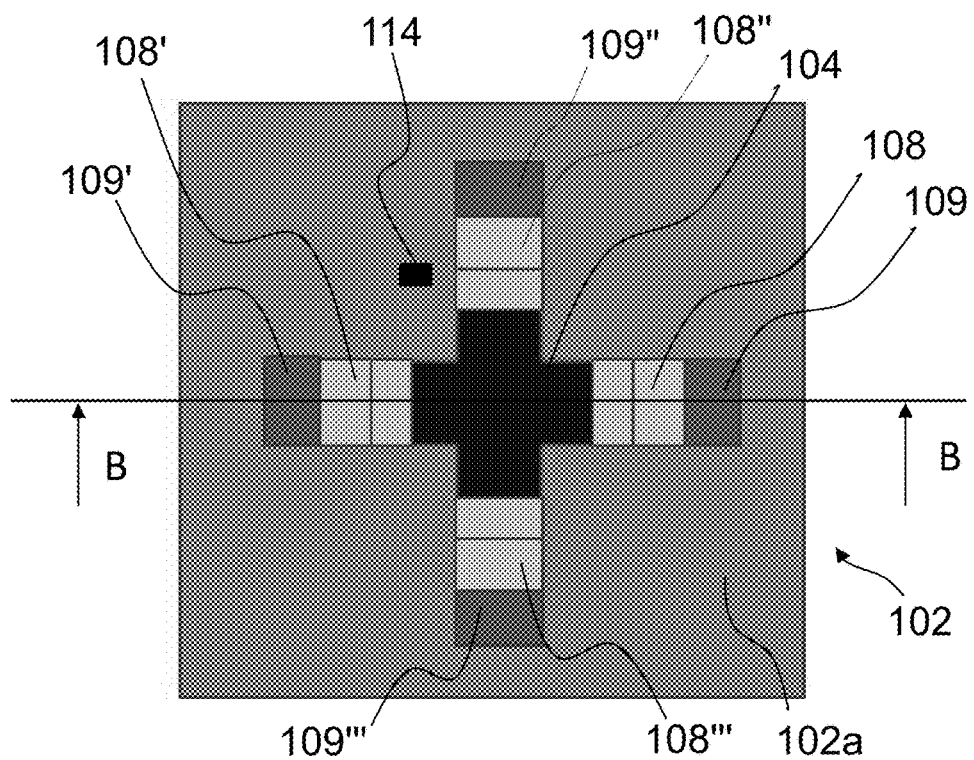
Figure 17B:
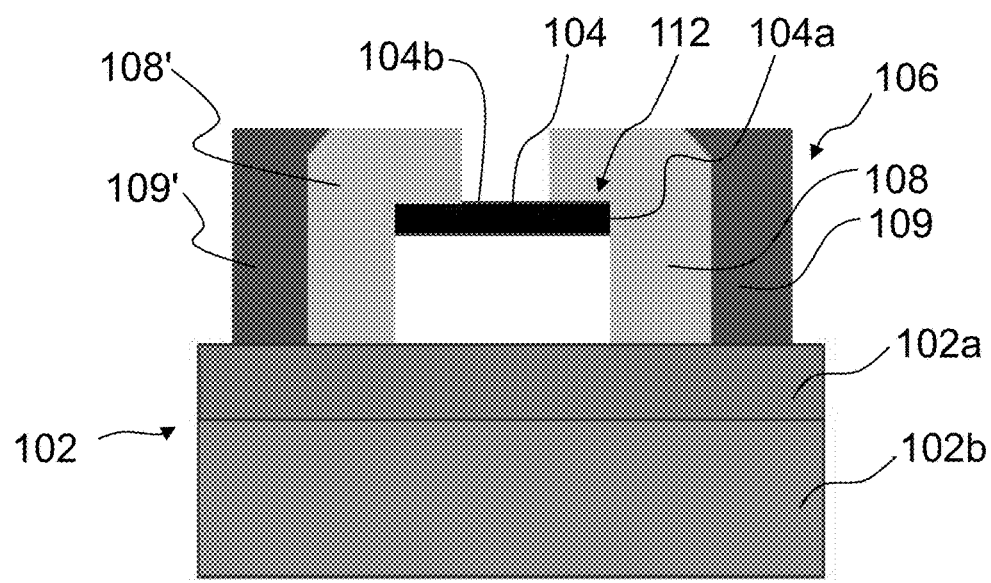

As shown in FIGS. 16A and 16B, the forming of second holding members 109, 109', 109'', 109''' may further include depositing a further material into the trenches 128. Since the trenches 128 are partially delimited by the holding pillars 108, 108', 108'', 108''', the material deposited into the trenches 128 is in physical contact with the holding pillars 108, 108', 108'', 108'''. Hereby, a layer 130 of the further material may be deposited onto the layer 126 of sacrificial material. This layer 130 may subsequently be removed together with the layer 126 of sacrificial material e. g. by chemical mechanical polishing (CMP). In this way, the shape and the dimensions of the second holding members 109, 109', 109'', 109''' may be defined. As shown in FIG. 17B, the second holding members 109, 109', 109'', 109''' may be polished to have the same dimensions as the corresponding first holding members 108, 108', 108'', 108''' in a direction pointing away from the carrier 102.

Subsequently, the layer 103 of catalytically active material can be removed at least at the interface 105 to the two-dimensional layer 104 or entirely, thereby obtaining a layer structure shown in FIGS. 17A and 17B.

The method may optionally include forming at least one heater 114 on the substrate 102. The heater 114 may be e. g. photolithographically patterned onto the carrier 102. In this way, a layer structure similar to the layer structure 100 shown in FIGS. 1A and 1B may be achieved.

Figure 18:
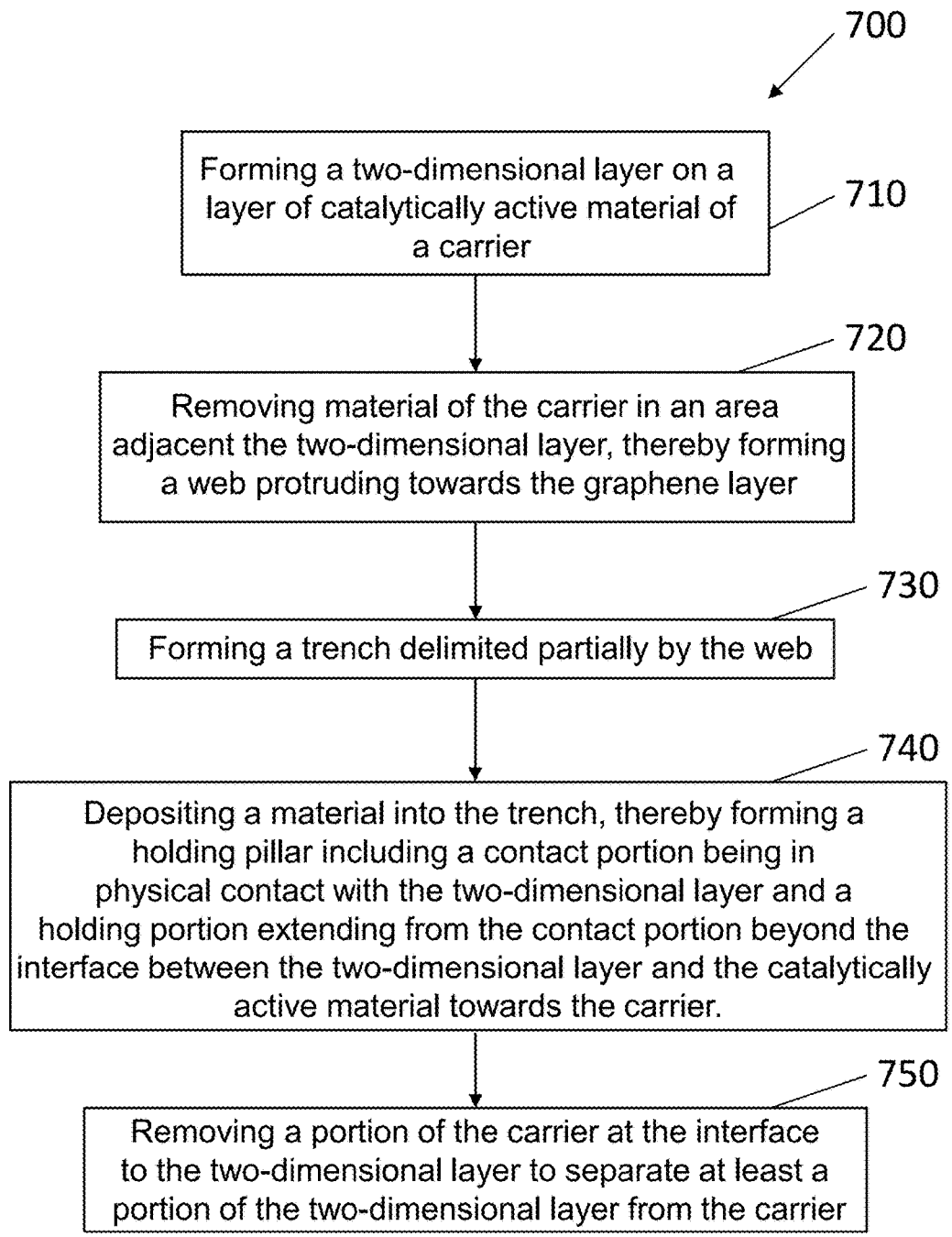
FIG. 18 shows flow diagram illustrating another exemplary method of manufacturing a layer structure.

FIG. 18 shows a flow diagram of another exemplary method 700 of manufacturing a layer structure, e. g. the layer structure shown in FIGS. 2A and 2B.

Method 700 may include:

forming a two-dimensional layer on a layer of catalytically active material of a carrier (710), removing material of the carrier in an area adjacent the two-dimensional layer, thereby forming a web protruding towards the two-dimensional layer (720), forming a trench delimited partially by the web (730), depositing a material into the trench, thereby forming a holding pillar including a contact portion being in physical contact with the two-dimensional layer and a holding portion extending from the contact portion beyond the interface between the two-dimensional layer and the catalytically active material towards the carrier (740), removing a portion of the carrier at the interface to the two-dimensional layer to separate at least a portion of the two-dimensional layer from the carrier (750).

The method 700 of FIG. 18 will be subsequently described in more detail with reference to FIGS. 19A to 23B. In these figures, those figures denominated by a suffix "A" show a plan view of the carrier 202 at different manufacturing stages, while those figures denominated by a suffix "B" show a sectional view of the carrier 202 according to line B-B in the respective plan view.

Figure 19A:
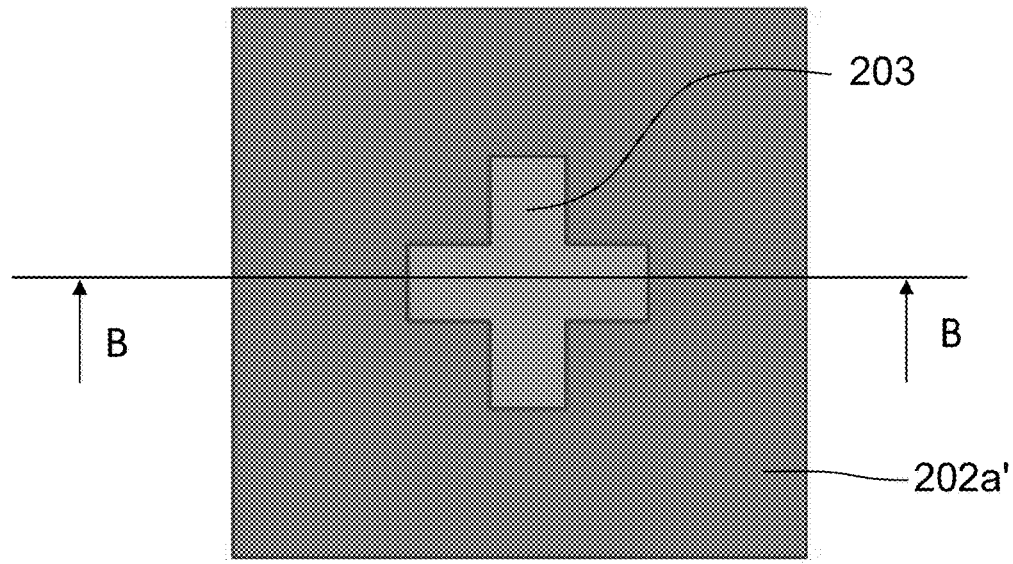
FIGS. 19A to 23B illustrate details of the exemplary method of FIG. 18.
Figure 19B:
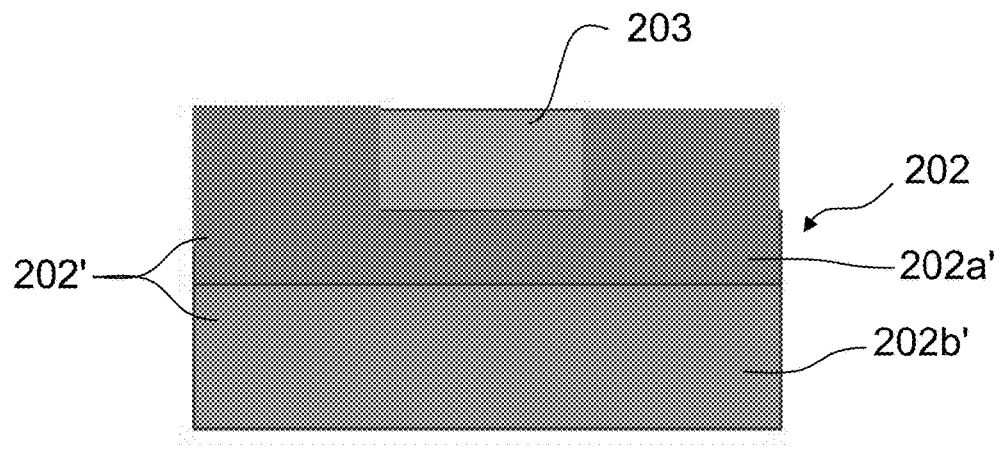
Figure 20A:
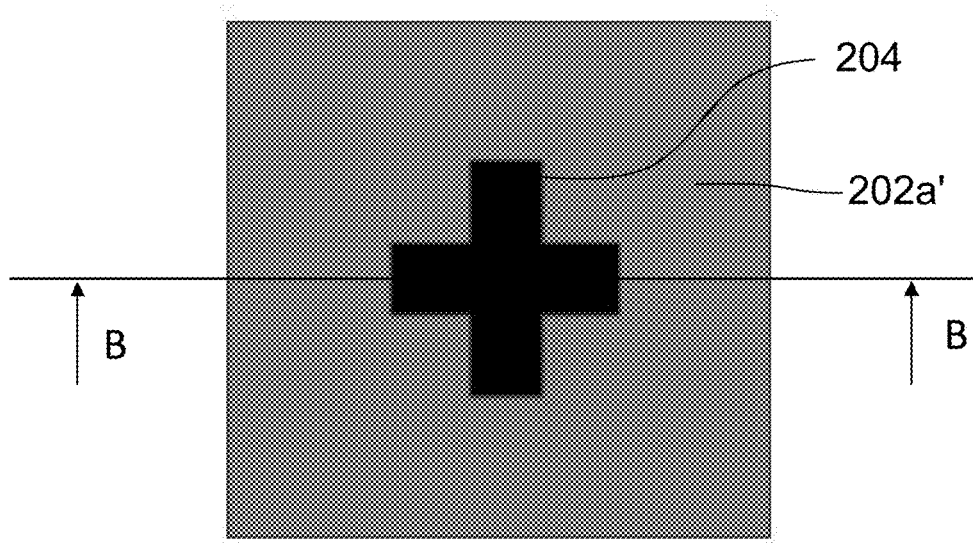
Figure 20B:
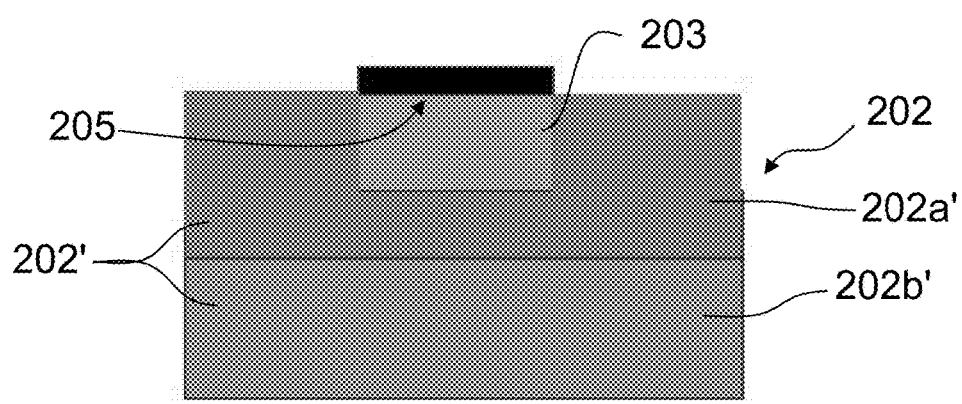

The carrier 202 on which the two-dimensional layer 204 is formed is shown in FIGS. 19A and 19B without a two-dimensional layer formed thereon. The substrate may include a base carrier 202' and a layer 203 of catalytically active material at a surface of the base carrier 202'. The layer 203 of catalytically active material may be partially embedded in the base carrier 202'. The base carrier 202' may include a plurality of layers 202a', 202b'. The layer 203 of catalytically active material may be embedded in an upper layer 202a' of the base carrier 202', e. g. by a damascene process.

The forming of the two-dimensional layer 204 on the carrier 202 may include depositing of at least one material selected from graphene, molybdenum sulphide, tungsten disulphide, tungsten diselenide, transition metal dichalcogenide, phosphorene, silicone, germanene, graphane, germanane, fluorographene, and fluorographane onto the layer 203 of catalytically active material, e. g. by chemical vapor deposition (CVD).

As mentioned above, the base carrier 202' may include a plurality of carrier layers 202a', 202b' made of materials with a melting point of above 80020 C. such as SiO$_2$ or Si$_3$N$_4$. The layer 203 of catalytically active material may include at least one of copper, platinum, iridium, gold, nickel, iron, manganese or palladium.

The above-mentioned materials adhere basically only to the layer 103 of catalytically active material. This layer can be provided with a desired shape such as a Hall cross. In this way, a subsequent structuring of the two-dimensional layer may be dispensable. However, it shall not be excluded that the method may also include a subsequent structuring of the two-dimensional layer 204.

The method may further include forming a holding structure 206 on the carrier 202 and on a portion of the two-dimensional layer 204 such that the holding structure 206 is configured to hold the two-dimensional layer 204 on the carrier 202.

The forming of the holding structure 206 may include forming of at least one or a plurality of trenches on the carrier 202. In the following, the forming of a plurality of trenches will be discussed.

Figure 21A:
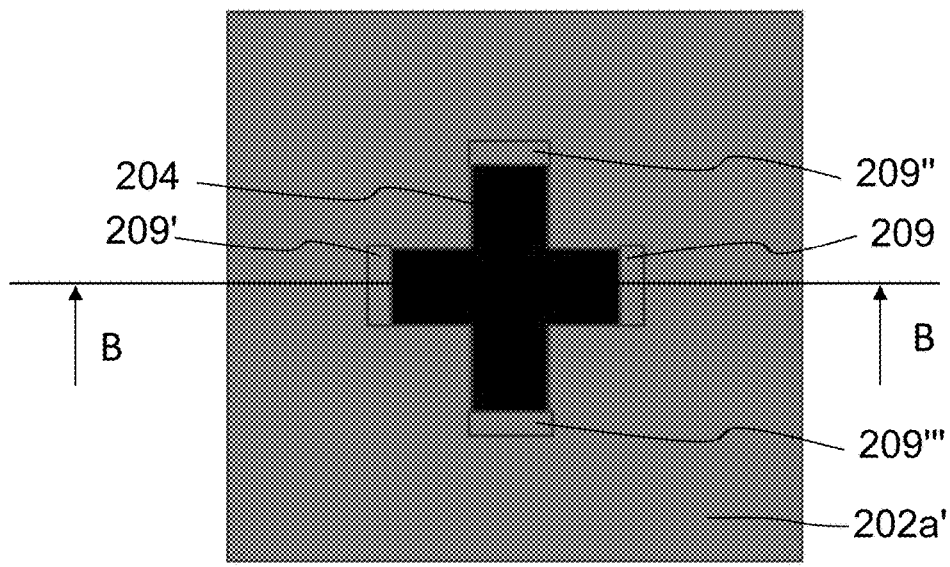
Figure 21B:
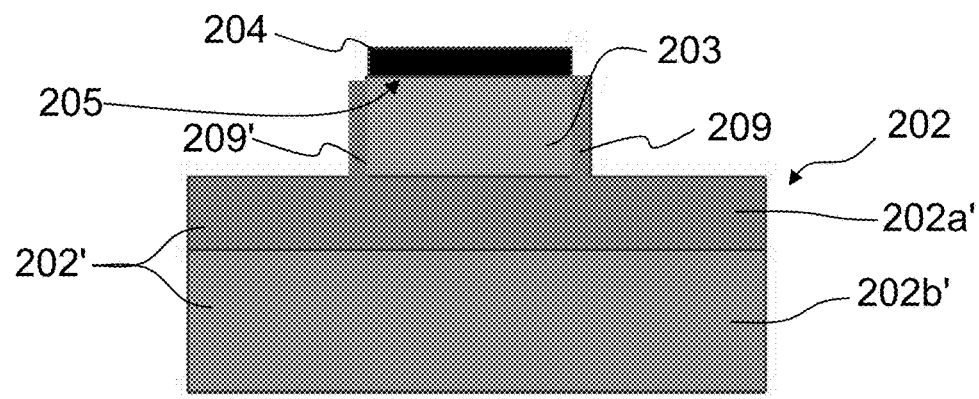

The forming of trenches may include depositing a layer of sacrificial material onto the carrier 202 and photolithographically exposing an area of the carrier layer 202a'. In this area, the carrier layer 202a' can be removed beyond the interface 205 between the two-dimensional layer 204 and the layer of catalytically active material 203. By removing part of the carrier layer 202a' webs 209, 209', 209'', 209''' delimiting the layer 203 of catalytically active material can be formed adjacent the two-dimensional layer 204, as shown in FIGS. 21A and 21B. These webs 209, 209', 209'', 209''' may correspond to the second holding members 209, 209', 209'', 209''' shown in FIGS. 2A and 2B. The webs 209, 209', 209'', 209''' may be integrally formed with the carrier layer 202a'.

The method may additionally include forming of further trenches 224 on the carrier 202, e. g. in a layer 220 of sacrificial material such as photoresist. The trenches 224 may be photolithographically formed in the layer 220 of sacrificial material. The trenches 224 may be partially delimited by the webs 209, 209', 209'', 209''', an outer circumferential portion 204a of the two-dimensional layer 204, and a surface 204b of the two-dimensional layer 204 facing away from the carrier 202.

Figure 22A:
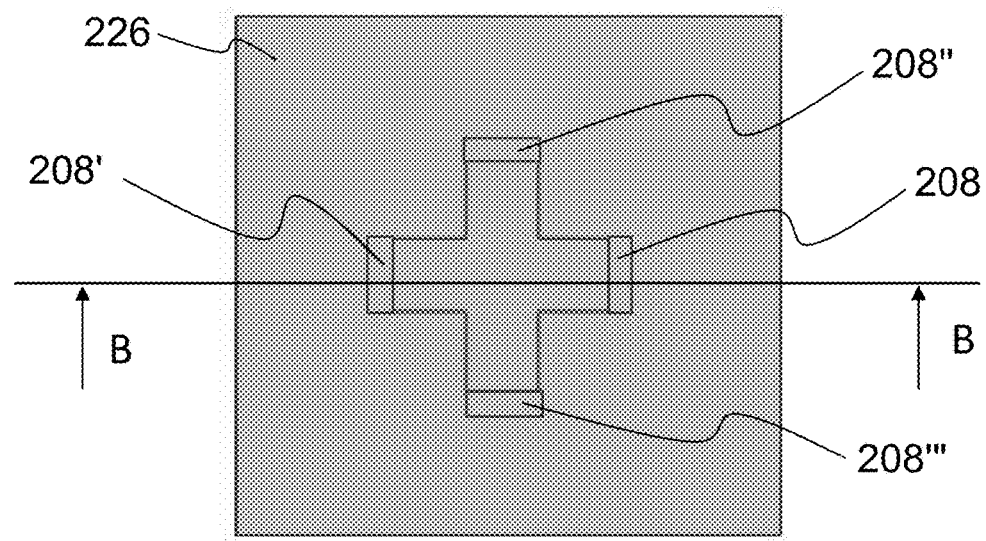
Figure 22B:
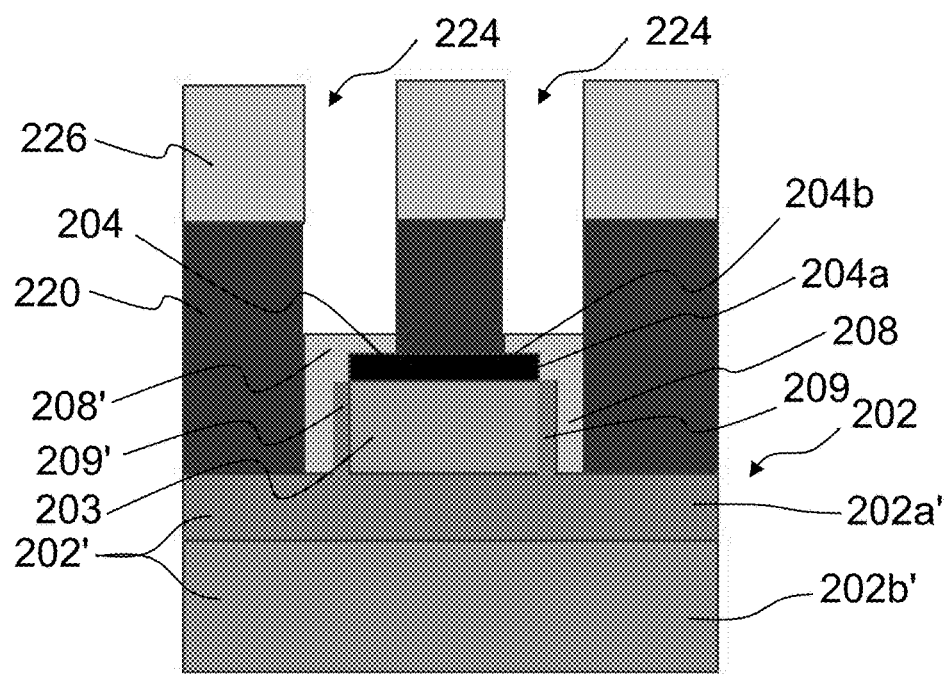

Subsequently, as indicated in FIGS. 22A and 22B, the trenches 224 may be filled with a material differing from the material of the carrier layer 202a' in view of the thermal expansion characteristics, thereby forming holding pillars 208, 208', 208'', 208''' being configured as first holding members. Since the trenches 224 are delimited by the webs 209, 209', 209'', 209''', the outer circumferential portions 204a of the two-dimensional layer 204, and the surface 204b of the two-dimensional layer 204 facing away from the carrier, the thus formed holding pillars 208, 208', 208'', 208''' are in physical contact with the webs 209, 209', 209'', 209''', an outer circumferential portion 204a of the two-dimensional layer 204, and a surface 204b of the two-dimensional layer 204 facing away from the carrier 202.

In the following, the layer 220 of sacrificial material may be removed together with a layer 226 formed on top of the layer 220 of sacrificial material during the deposition of the further material into the trenches 224.

Subsequently, the layer 203 of catalytically active material may be removed at least at the interface 205 to the two-dimensional layer 204. As indicated in FIG. 23B, the layer 203 of catalytically active material can be entirely removed, thereby separating the entire two-dimensional layer 204 from the substrate 202.

Figure 23A:
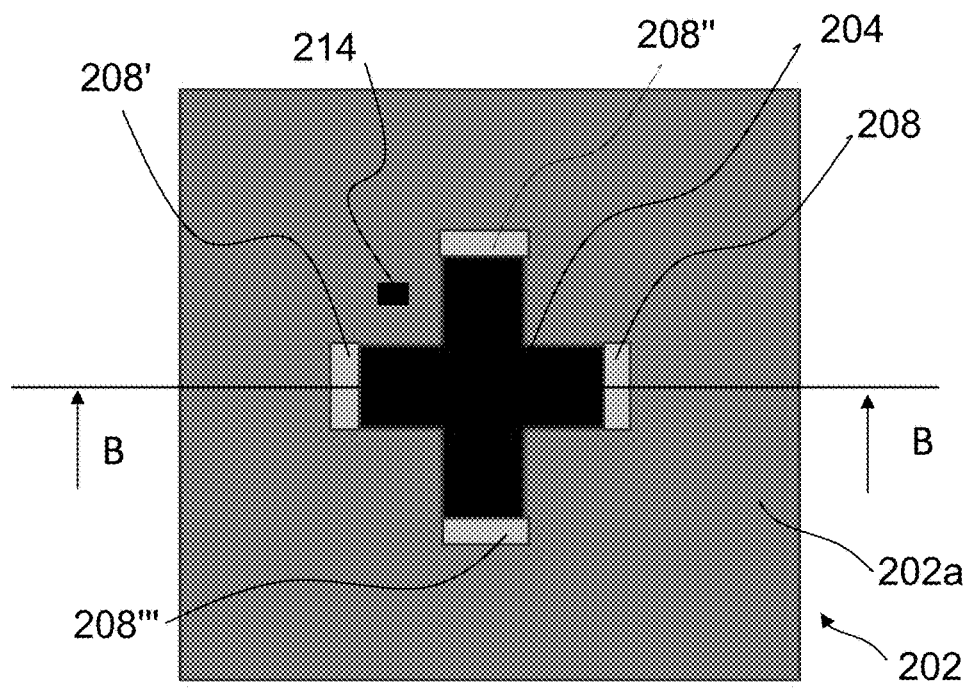
Figure 23B:
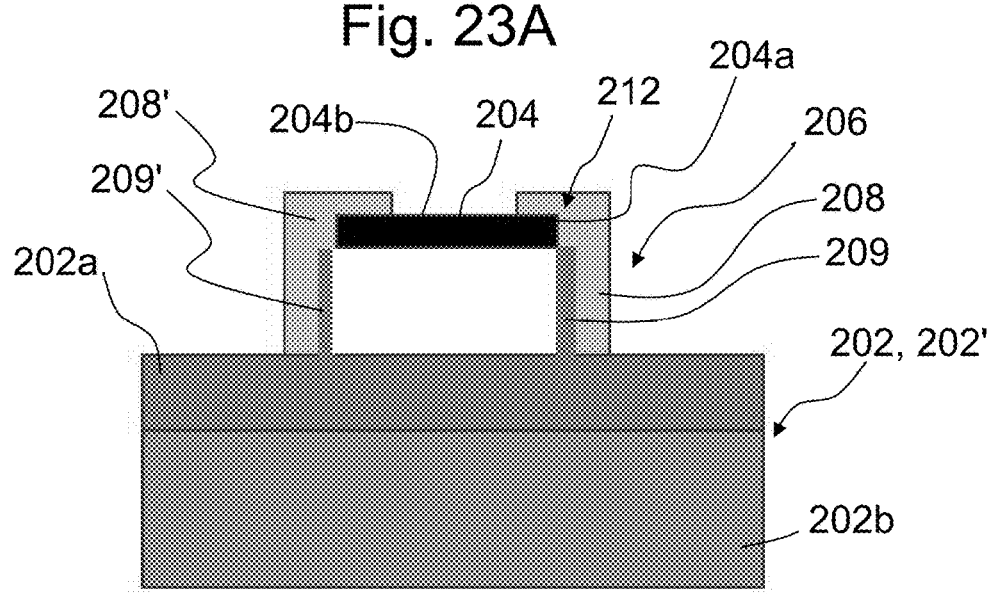

By removing the entire layer 203 of catalytically active material, the base carrier 202' becomes identical to the carrier 202, as shown in FIG. 23B.

The method 700 may also include forming one heater 214 or a plurality of heaters 214 on the carrier 202 adjacent one or several of the plurality of holding members 208, 208', 208'', 208''', 209, 209', 209'', 209'''.

By the above described exemplary manufacturing methods, a suspended two-dimensional layer can be formed that, contrary to conventional methods, does not have to be transferred from a growth substrate on which it is originally grown. In this way, the risk of damaging the two-dimensional layer can be reduced, thereby ensuring the maintenance of the properties of the two-dimensional layers 104, 204 such as their high charge carrier mobilities and their high Young's moduli.

In the following, various aspects of this disclosure will be illustrated:

Example 1 is a layer structure. The layer structure may include a carrier, a two-dimensional layer, and a holding structure. The holding structure is arranged on the carrier and holds the two-dimensional layer on the carrier such that at least a portion of the two-dimensional layer is spaced apart from the carrier. The holding structure includes a holding portion extending from the two-dimensional layer towards the carrier beyond the at least a portion of the two-dimensional layer spaced apart from the carrier.

In Example 2, the subject matter of Example 1 can optionally include that the two-dimensional layer is made of a layer material including at least one of graphene, a graphene-related material, transition metal dichalcogenide, phosphorene, silicene, germanene, graphane, germanane, fluorographene, and fluorographane.

In Example 3, the subject matter of Example 2 can optionally include that the graphene-related material includes at least one of 2D molybdenum sulphide, tungsten disulphide, and tungsten diselenide.

In Example 4, the subject matter of any one of Examples 1 to 3 can optionally include that the holding portion is in physical contact with the carrier.

In Example 5, the subject matter of any one of Examples 1 to 4 can optionally include that the holding structure includes a contact portion contacting the at least a portion of the two-dimensional layer.

In Example 6, the subject matter of Example 5 can optionally include that the contact portion contacts an outer circumferential portion of the two-dimensional layer.

In Example 7, the subject matter of any one of Examples 5 or 6 can optionally include that the contact portion contacts a surface of the two-dimensional layer facing away from the carrier.

In Example 8, the subject matters of Examples 6 and 7 can optionally include that the contact portion is an angled portion of the holding structure contacting both the outer circumferential portion of the two-dimensional layer and the surface of the two-dimensional layer facing away from the carrier.

In Example 9, the subject matter of any one of Examples 5 to 8 can optionally include that the holding structure includes a holding pillar including the contact portion and the holding portion.

In Example 10, the subject matter of Example 9 can optionally include that the holding pillar is formed in one piece.

In Example 11, the subject matters of any one of Examples 9 or 10 can include that the holding pillar has a dimension in a direction pointing away from the carrier in the range from about 500 nm to about 50 µm.

In Example 12, the subject matter of Example 11 can optionally include that the holding pillar has a dimension in a direction pointing away from the carrier in the range from about 4 µm to about 20 µm.

In Example 13, the subject matter of Example 12 can optionally include that the holding pillar has a dimension in a direction pointing away from the carrier in the range from about 5 µm to about 10 µm.

In Example 14, the subject matter of any one of Examples 9 to 13 can optionally include that the ratio of a diameter of the two-dimensional layer to a dimension of the holding pillar in a direction pointing away from the carrier ranges up to maximum 20:1.

In Example 15, the subject matter of Example 14 can optionally include that the ratio of a diameter of the two-dimensional layer to a dimension of the holding pillar in a direction pointing away from the carrier is 10:1.

In Example 16, the subject matter of any one of Examples 9 to 15 can optionally include that a plurality of holding pillars holding a plurality of portions of the two-dimensional layer.

In Example 17, the subject matter of any one of Examples 9 to 16 can optionally include that the holding pillar is at least partially made of an electrically conductive material.

In Example 18, the subject matter of any one of Examples 1 to 17 can optionally include that the entire two-dimensional layer is spaced apart from the carrier.

Example 19 is an array. The array may include a plurality of layer structures of any one of Examples 1 to 18.

Example 20 is a device. The device may include a layer structure of any one of Examples 1 to 18, and an electronic circuit coupled with the layer structure to detect an electrical signal from the two-dimensional layer.

In Example 21, the subject matter of Example 20 can optionally include that the device is configured as a sensor.

In Example 22, the subject matter of Example 21 can optionally include that the device is configured as a microphone.

Example 23 is a device. The device may include a layer structure of any one of Examples 1 to 18, and an electronic circuit coupled with the layer structure to provide an electrical signal to the two-dimensional layer.

In Example 24, the subject matter of Example 23 can optionally include that the device is configured as an actor.

In Example 25, the subject matter of Example 24 can optionally include that the device is configured as a loudspeaker.

Example 26 is a layer structure. The layer structure may include a carrier, a two-dimensional layer, and a holding structure. The holding structure is arranged on the carrier and holds the two-dimensional layer on the carrier such that at least a portion of the two-dimensional layer is spaced apart from the carrier. The holding structure includes at least two holding members being in physical contact with each other and having different thermal expansion characteristics.

In Example 27, the subject matter of Example 26 can optionally include that the two-dimensional layer is made of a layer material including at least one of graphene, a graphene-related material, transition metal dichalcogenide, phosphorene, silicene, germanene, graphane, germanane, fluorographene, and fluorographane.

In Example 28, the subject matter of any one of Examples 26 or 27 can optionally include that the graphene-related material includes at least one of 2D molybdenum sulphide, tungsten disulphide, and tungsten diselenide.

In Example 29, the subject matter of any one of Examples 26 to 28 can optionally include that the at least two holding members are in physical contact with each other along mutually complementary contact surfaces.

In Example 30, the subject matter of any one of Examples 26 to 29 can optionally include that at least one of the holding members is made of an electrically conductive material.

In Examples 31, the subject matter of any one of Examples 26 to 30 can optionally include that at least one holding member is made of a material of the carrier.

In Example 32, the subject matter of Example 31 can optionally include the at least one holding member made of a material of the carrier is integrally formed with the carrier.

In Example 33, the subject matter of any one of Examples 26 to 32 can optionally further include a heater configured to heat the at least two holding members.

In Example 34, the subject matter of any one of Examples 26 to 33 can optionally include that the holding structure includes a holding portion extending from the two-dimensional layer towards the carrier beyond the at least a portion of the two-dimensional layer spaced apart from the carrier.

In Example 35, the subject matter of Example 34 can optionally include that the holding portion is in physical contact with the carrier.

In Example 36, the subject matter of any one of Examples 34 or 35 can optionally include that at least one holding member includes a holding portion.

In Example 37, the subject matter of Example 36 can optionally include that each holding member includes a holding portion.

In Example 38, the subject matter of any one of Examples 26 to 37 can optionally include that the holding structure includes a contact portion contacting the at least a portion of the two-dimensional layer spaced apart from the carrier.

In Example 39, the subject matter of Example 38 can optionally include that the contact portion contacts an outer circumferential portion of the two-dimensional layer.

In Example 40, the subject matter of any one of Examples 38 or 39 can optionally include that the contact portion contacts a surface of the two-dimensional layer facing away from the carrier.

In Example 41, the subject matter of Examples 39 and 40 can optionally include that the contact portion is an angled portion of the holding structure contacting both the outer circumferential portion of the two-dimensional layer and the surface of the two-dimensional layer facing away from the carrier.

In Example 42, the subject matter of any one of Examples 34 to 37 and any one of Examples 38 to 41 can optionally include that the holding structure includes a holding pillar including the contact portion and the holding portion.

In Example 43, the subject matter of Example 42 and any one of Examples 36 or 37 can optionally include that the holding pillar is configured as a first holding member which is in physical contact with a second holding member.

In Example 44, the subject matter of Example 43 can optionally include that the first and second holding members are in physical contact with each other at a surface of the first holding member facing away from the two-dimensional layer or facing towards the two-dimensional layer.

In Example 45, the subject matter of Example 44 can optionally include that the first and second holding members are co-extensive in a direction pointing away from the carrier.

In Example 46, the subject matter of any one of Examples 43 to 45 can optionally include that the first and second holding members have co-planar end faces at a side facing away from the carrier.

In Example 47, the subject matter of any one of Examples 42 to 46 can optionally include that the holding pillar is formed in one piece.

In Example 48, the subject matter of any one of Examples 42 to 47 can optionally include that the holding pillar has a dimension in a direction pointing away from the carrier in the range from about 500 nm to about 50 µm.

In Example 49, the subject matter of Example 48 can optionally include that the pillar has a dimension in a direction pointing away from the carrier in the range from about 4 µm to about 20 µm.

In Example 50, the subject matter of Example 49 can optionally include that the pillar has a dimension in a direction pointing away from the carrier in the range from about 5 µm to about 10 µm.

In Example 51, the subject matter of any one of Examples 42 to 50 can optionally include that the ratio of a diameter of the two-dimensional layer to a dimension of the holding pillar in a direction pointing away from the carrier ranges up to maximum 20:1.

In Example 52, the subject matter of Example 51 can optionally include that the ratio of a diameter of the two-dimensional layer to a dimension of the holding pillar in a direction pointing away from the carrier is 10:1.

In Example 53, the subject matter of any one of Examples 42 to 52 can optionally include a plurality of holding pillars holding a plurality of portions of the two-dimensional layer.

In Example 54, the subject matter of any one of Examples 42 to 53 can optionally include that the holding pillar is at least partially made of an electrically conductive material.

In Example 55, the subject matter of any one of Examples 26 to 54 can optionally include that the entire two-dimensional layer is spaced apart from the carrier.

Example 56 is an array. The array may include a plurality of layer structures of any one of Examples 26 to 55.

Example 57 is a device. The device may include a layer structure of any one of Examples 26 to 55, and an electronic circuit coupled with the layer structure to detect an electrical signal from the two-dimensional layer.

In Example 58, the subject matter of Example 57 can optionally include that the device is configures as a sensor.

In Example 59, the subject matter of Example 58 can optionally include that the device is configured as a microphone.

Example 60 is a device. The device may include a layer structure of any one of Examples 26 to 55, and an electronic circuit coupled with the layer structure to provide an electrical signal to the two-dimensional layer.

In Example 61, the subject matter of Example 60 can optionally include that the device is configured as an actor.

In Example 62, the subject matter of Example 61 can optionally include that the device is configured as a loudspeaker.

Example 63 is a method of manufacturing a layer structure. The method may include forming a two-dimensional layer on a carrier, forming a holding structure on the carrier and on a portion of the two-dimensional layer such that the holding structure is configured to hold the two-dimensional layer on the carrier, and removing a portion of the carrier at the interface to the two-dimensional layer to separate at least a portion of the two-dimensional layer from the carrier.

In Example 64, the subject matter of Example 63 can optionally include that the carrier includes a base carrier and a layer of catalytically active material at a surface of the base carrier, and the forming of the two-dimensional layer on the carrier includes depositing material of the two-dimensional layer onto the layer of catalytically active material.

In Example 65, the subject matter of Example 64 can optionally include that the layer of catalytically active material is partially embedded in the base carrier.

In Example 66, the subject matter of any one of Examples 64 or 65 can optionally include that the layer of catalytically active material includes at least one of copper, platinum, iridium, gold, nickel, iron, manganese, and palladium.

In Example 67, the subject matter of any one of Examples 63 to 66 can optionally include structuring the two-dimensional layer.

In Example 68, the subject matter of any one of Examples 63 to 67 can optionally include that the forming of the holding structure includes forming a trench on or in the carrier extending beyond the interface between the two-dimensional layer and the catalytically active material.

In Example 69, the subject matter of Example 68 can optionally include that a dimension of the portion of the trench extending beyond the interface between the two-dimensional layer and the catalytically active material is larger than a diameter of the two-dimensional layer.

In Example 70, the subject matter of any one of Examples 68 or 69 can optionally include that the forming of a trench includes removing catalytically active material in an area adjacent the two-dimensional layer.

In Example 71, the subject matter of any one of Examples 68 to 70 can optionally include that the forming of a trench includes removing material of the base carrier in an area adjacent the two-dimensional layer.

In Example 72, the subject matter of Example 71 can optionally include that the removing of material of the base carrier includes forming a web protruding towards the two-dimensional layer and delimiting the trench.

In Example 73, the subject matter of any one of Examples 68 to 72 can optionally include that the forming of a trench includes forming of a portion of the trench using a sacrificial material.

In Example 74, the subject matter of any one of Examples 63 to 73 can optionally include that the forming of a holding structure includes depositing a material into the trench, thereby forming a holding pillar including a contact portion being in physical contact with the two-dimensional layer and a holding portion extending from the contact portion beyond the interface between the two-dimensional layer and the catalytically active material towards the base carrier.

In Example 75, the subject matter of Example 74 can optionally include that the contact portion contacts a circumferential portion of the two-dimensional layer.

In Example 76, the subject matter of any one of Examples 74 or 75 can optionally include that the contact portion contacts a surface of the two-dimensional layer facing away from the base carrier.

In Example 77, the subject matter of Example 72 and any one of Examples 74 to 76 can optionally include that the material deposited into the trench is deposited to be in physical contact with the web.

In Example 78, the subject matter of Example 77 can optionally include that the material deposited into the trench and the material of the web have different thermal expansion characteristics.

In Example 79, the subject matter of any one of Examples 74 to 78 can optionally include that the material deposited into the trench includes an electrically conductive material.

In Example 80, the subject matter of Example 73 and any one of Examples 74 to 79 can optionally include removing the sacrificial material after depositing the material into the trench.

In Example 81, the subject matter of any one of Examples 74 to 80 can optionally include that the forming of a holding structure includes forming of a further trench on or in the carrier delimited partially by the holding pillar and depositing a further material into the further trench such as to be in contact with the holding pillar.

In Example 82, the subject matter of Example 81 can optionally include that the further trench is formed in the layer of catalytically active material.

In Example 83, the subject matter of any one of Examples 81 or 82 can optionally include that the forming of the further trench includes forming of a portion of the further trench using a sacrificial material.

In Example 84, the subject matter of any one of Examples 81 to 83 can optionally include that the further material deposited into the further trench and the material of the holding pillar have different thermal expansion characteristics.

In Example 85, the subject matter of any one of Examples 83 or 84 can optionally include removing the sacrificial material forming a portion of the further trench after depositing the further material into the further trench.

In Example 86, the subject matter of any one of Examples 63 to 85 can optionally include that the removing of a portion of the carrier at the interface to the two-dimensional layer includes removing catalytically active material at the interface to the two-dimensional layer.

In Example 87, the subject matter of any one of Examples 63 to 86 can optionally include that the removing of a portion of the carrier at the interface to the two-dimensional layer completely separates the two-dimensional layer from the carrier.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A layer structure, comprising:
    carrier;
    a two-dimensional layer comprising a first surface facing away from the carrier, a second surface opposite the first surface towards the carrier, and an edge surface; and
    a holding structure;
    wherein the holding structure is arranged on the carrier and holds the two-dimensional layer such that the second surface of the two-dimensional layer is free of the holding structure and is spaced apart from the carrier thereby forming an empty space between the carrier and the second surface of the two-dimensional layer;
    wherein the holding structure comprises a contact portion contacting the first surface of the two-dimensional layer;
    wherein the holding structure comprises a holding portion arranged on the carrier beyond the edge surface of the two-dimensional layer such that the holding portion is not in contact with the second surface of the two two-dimensional layer and extends a distance between the carrier and the second surface of the two-dimensional layer;

wherein the holding structure comprises a holding pillar comprising the contact portion and the holding portion; and wherein the holding pillar is at least partially made of an electrically conductive material.

2. The layer structure of claim 1, wherein the two-dimensional layer is made of a layer material including at least one of graphene, a graphene-related material, transition metal dichalcogenide, phosphorene, silicene, germanene, graphane, germanane, fluorographene, and fluorographane.

3. The layer structure of claim 1, wherein the entirety of the two-dimensional layer is spaced apart from the carrier.

4. The layer structure of claim 1, wherein the contact portion further physically contacts the edge surface of the two-dimensional layer.

5. The layer structure of claim 4, wherein the contact portion is angled so that the holding pillar is substantially L-shaped.

6. The layer structure of claim 1, wherein the height of the holding pillar is in the range from about 500 nm to about 50 µm;

wherein the ratio of a diameter of the two-dimensional layer to the height of the holding pillar is less than 20:1.

7. The layer structure of claim 1, wherein the holding pillar comprises at least two holding members being in physical contact with each other and having different thermal expansion characteristics;

wherein each of the at least two holding members comprises an inward surface facing towards the empty space and an outward surface opposite the inward surface facing away from the empty space; and wherein the outward surface of one of the at least two holding members is in physical contact with the inward surface of another of the at least two holding members.

8. The layer structure of claim 7, further comprising a heater arranged on the carrier adjacent to the holding pillar, the heater configured to heat the holding pillar.

9. An array, comprising a plurality of layer structures, wherein the layer structure comprises, a carrier;

a two-dimensional layer comprising a first surface facing away from the carrier, a second surface opposite the first surface facing towards the carrier, and an edge surface; and a holding structure;

wherein the holding structure is arranged on the carrier and holds the two-dimensional layer such that at the second surface of the two-dimensional layer is free of the holding structure and is spaced apart from the carrier thereby forming an empty space between the carrier and the second of the two-dimensional layer;

wherein the holding structure comprises a holding portion disposed beyond the edge surface of the two-dimensional layer such that the holding portion is not in contact with the second surface of the two-dimensional layer and spans a distance between the carrier and the second surface of the two-dimensional layer;

wherein the holding structure comprises a contact portion contacting the first surface of the two-dimensional layer;

wherein the holding structure comprises a holding pillar comprising the contact portion and the holding portion; and wherein the holding pillar is at least partially made of an electrically conductive material.

10. A layer structure, comprising:

a carrier;

a two-dimensional layer comprises a first surface facing away from the carrier, a second surface opposite the first surface towards the carrier, and an edge surface; and a holding structure;

wherein the holding structure is arranged on the carrier and holds the two-dimensional layer such that the first surface of the two-dimensional layer is in contact with the holding structure and the second surface of the two-dimensional layer is free of the holding structure and the two-dimensional layer is spaced apart from the carrier thereby forming an empty space between the carrier and the second surface of the two-dimensional layer;

wherein the holding structure comprises at least two holding members being in physical contact with each other and having different thermal expansion characteristics;

wherein each of the at least two holding members comprises an inward surface facing towards the empty space and an outward surface opposite the inward surface facing away from the empty space; and wherein the outward surface of one of the at least two holding members is in physical contact with the inward surface of another one of the at least two holding members.

11. The layer structure of claim 10, wherein the two-dimensional layer is made of a layer material including at least one of graphene, a graphene-related material, transition metal dichalcogenide, phosphorene, silicene, germanene, graphane, germanane, fluorographene, and fluorographane.

12. The layer structure of claim 11, wherein the graphene-related material comprises at least one of 2D molybdenum sulphide, tungsten disulphide, and tungsten diselenide.

13. The layer structure of claim 10, wherein at least one of the holding members is made of an electrically conductive material.

14. The layer structure of claim 10, further comprising:

a heater arranged on the carrier adjacent to the at least two holding members, the heater configured to heat the at least two holding members.

15. The layer structure of claim 10, wherein the holding structure comprises a plurality of holding pillars evenly arranged around the perimeter of the two-dimensional layer, each holding pillar comprising a first holding member and a second holding member of the at least two holding members;

wherein each of the at least two holding members comprises and inward surface facing towards the empty space and an outward surface opposite the inward surface facing away from the empty space;

wherein the first holding member comprises an electrically conductive material; and wherein the first and second holding members are in physical contact with each other along mutually complementary surfaces so that the outward surface of the holding member is in physical contact with the inward surface of the second holding member.

16. An array, comprising a plurality of layer structures, wherein the layer structure comprises:
a carrier;
a two-dimensional layer comprising a first surface facing away from the carrier, a second surface opposite the first surface facing towards the carrier, and an edge surface; and
a holding structure;
wherein the holding structure is arranged on the carrier and holds the two-dimensional layer such that the first surface of the two-dimensional layer is in contact with the holding structure and the second surface of the two-dimensional layer is free of the holding structure and the two-dimensional layer spaced apart from the carrier thereby forming an empty space between the carrier and the second surface of the two-dimensional layer;
wherein the holding structure comprises at least two holding members being in physical contact with each other and having different thermal expansion characteristics;
wherein each of the at least two holding members comprises an inward surface facing towards the empty space and an outward surface opposite the inward surface facing away from the empty space; and
wherein the outward surface of one of the at least two holding members is in physical contact with the inward surface of another one of the at least two holding members.

17. A layer structure, comprising:
a carrier;
a two-dimensional layer; and
a holding structure;
wherein the two-dimensional layer comprises a first surface facing away from the carrier, a second surface opposite the first surface facing towards the carrier, and an edge surface at the perimeter of the two-dimensional layer;
wherein the holding structure is arranged on the carrier and holds the two-dimensional layer such that the second surface of the two-dimensional layer is free of the holding structure and is spaced apart from the carrier thereby forming an empty space between the carrier and the second surface of the two-dimensional layer;
wherein the holding structure comprises a plurality of holding pillars evenly arranged around the perimeter of the two-dimensional layer, each holding pillar comprising a holding portion and a contact portion;
wherein the holding portion is arranged on the carrier beyond the edge surface of the two-dimensional layer so that the holding portion is not under the two-dimensional layer, the holding portion spans at least a distance of the empty space between the carrier and the second surface of the two-dimensional layer;
wherein the contact portion contacts the edge surface and the first surface of the two-dimensional layer;
wherein each holding pillar comprises a first holding member and a second holding member where the thermal expansion characteristics of the first holding member is different from the thermal expansion characteristics of the second holding member;
wherein each of the at least two holding members comprises and inward surface facing towards the empty space and an outward surface opposite the inward surface facing away from the empty space;
wherein the outward surface of the first holding member is in physical contact with the inward surface of the second holding member;
wherein the first holding ,member ,comprises the ,contact portion; and wherein the first holding member comprises an electrically conductive material.

* * * * *

UNITED STATES PATENT AND TRADEMARK OFFICE
CERTIFICATE OF CORRECTION

PATENT NO. : 10,370,240 B2
APPLICATION NO. : 15/646161
DATED : August 6, 2019
INVENTOR(S) : Matthias Koenig et al.

Page 1 of 1

It is certified that error appears in the above-identified patent and that said Letters Patent is hereby corrected as shown below:

In the Claims

Column 16, Line 48: Please change "carrier" to --a carrier--.

Column 17, Line 58: Please change "carrier and the second of the" to --carrier and the second surface of the--.

Column 18, Line 8: Please change "comprises a first surface" to --comprising a first surface--.

Column 18, Line 10: Please change "first surface towards" to --first surface facing towards--.

Column 19, Line 2-3: Please change "surface of the holding" to --surface of the first holding--.

Column 19, Line 18: Please change "layer spaced" to --layer is spaced--.

Column 20, Line 36: Please change "the first holding, member, comprises the, contact" to --the first holding member comprises the contact--.

Signed and Sealed this
Fourteenth Day of January, 2020

Andrei Iancu
*Director of the United States Patent and Trademark Office*